United States Patent
Asano et al.

(10) Patent No.: US 6,914,280 B2
(45) Date of Patent: Jul. 5, 2005

(54) SWITCHING CIRCUIT DEVICE

(75) Inventors: Tetsuro Asano, Oizumi-machi (JP); Mikito Sakakibara, Menuma-machi (JP); Yoshibumi Nakajima, Ashikaga (JP); Hidetoshi Ishihara, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 45 days.

(21) Appl. No.: 10/686,788

(22) Filed: Oct. 17, 2003

(65) Prior Publication Data

US 2004/0130380 A1 Jul. 8, 2004

(30) Foreign Application Priority Data

Oct. 17, 2002 (JP) .................................... 2002-303484
Sep. 8, 2003 (WO) ................................ PCT/JP03/11419

(51) Int. Cl.[7] .................... H01L 29/80; H01L 29/40; H01L 23/34; H01P 1/00
(52) U.S. Cl. .................... 257/275; 257/277; 257/664; 257/725; 257/726; 257/E29.116; 257/155; 257/160; 333/247
(58) Field of Search .................... 257/275, 277, 257/664, 725, 728, E29.116, 155, 160; 333/247

(56) References Cited

U.S. PATENT DOCUMENTS

| | | | | |
|---|---|---|---|---|
| 4,387,386 A | * | 6/1983 | Garver | .................... 333/81 R |
| 4,626,802 A | * | 12/1986 | Gailus | .................... 331/117 FE |
| 4,745,445 A | * | 5/1988 | Mun et al. | .................... 257/275 |
| 4,843,440 A | * | 6/1989 | Huang | .................... 257/256 |
| 5,371,405 A | * | 12/1994 | Kagawa | .................... 257/664 |
| 5,374,899 A | * | 12/1994 | Griffiths et al. | .................... 330/277 |
| 5,559,363 A | * | 9/1996 | Immorlica, Jr. | .................... 257/664 |
| 5,821,827 A | * | 10/1998 | Mohwinkel et al. | .................... 331/99 |
| 5,841,184 A | * | 11/1998 | Li | .................... 257/580 |
| 6,002,860 A | * | 12/1999 | Voinigescu et al. | .................... 703/14 |
| 6,580,107 B2 | | 6/2003 | Higashino et al. | |
| 2002/0024375 A1 | | 2/2002 | Asano et al. | |
| 2002/0047177 A1 | | 4/2002 | Asano et al. | |

FOREIGN PATENT DOCUMENTS

| JP | 2723936 | 12/1988 |
|---|---|---|
| JP | 8-236549 | 3/1995 |

* cited by examiner

*Primary Examiner*—Long Pham
*Assistant Examiner*—Shrinivas H. Rao
(74) *Attorney, Agent, or Firm*—Morrison & Foerster LLP

(57) ABSTRACT

Since a 5 GHz-band broadband has a frequency twice that of 2.4 GHz, the parasitic capacitance greatly influences deterioration in isolation of a switching device used in this frequency region. Therefore, to improve isolation, a shunt FET is added to the device. The switching device also includes a protecting element that has a first $n^+$-type region, an insulating region and a second $n^+$-type region. This protecting element is connected in parallel between two electrodes of the shunt FET. Since electrostatic charges are discharged between the first and second $n^+$-type regions, the electrostatic energy reaching an operation region of the shunt FET can be reduced without an increase in parasitic capacitance.

35 Claims, 28 Drawing Sheets

FIG.14A
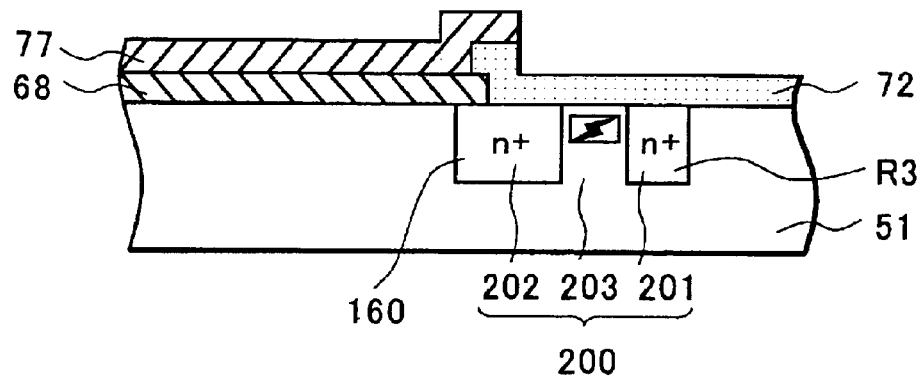
FIG.14B
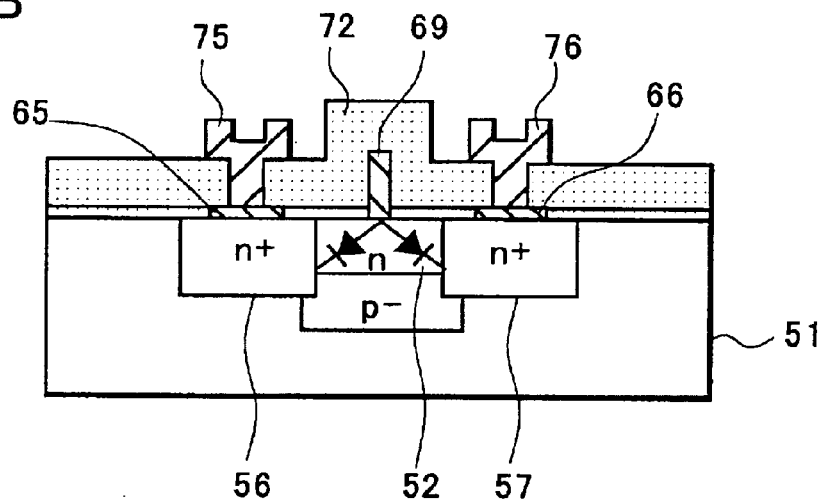
FIG.14C
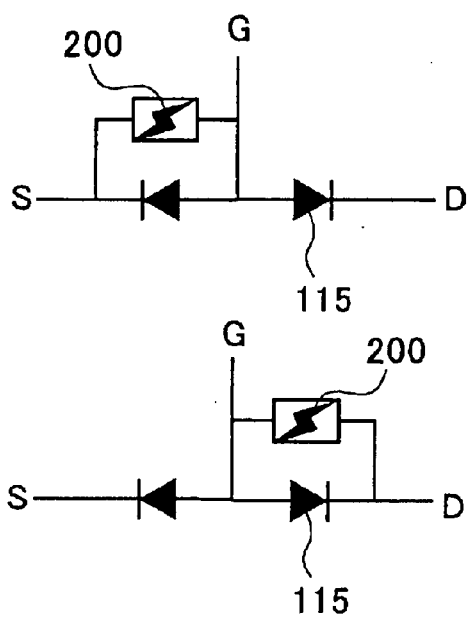
FIG.14D

Comparison of spreading of currents and recombination

|  | a-structure | | | b-structure-1 | | | b-structure-2 | | |
|---|---|---|---|---|---|---|---|---|---|
|  | y_2 | x_0 | Product | y_2 | x_0 | Product | y_2 | x_0 | Product |
| Electron current density | 21.9 | 10.5 | 230.0 | 26 | 15 | 390.0 | 23.8 | 11.3 | 268.9 |
| Hole current density | y_2 | x_0 |  | y_2 | x_0 |  | y_2 | x_0 |  |
|  | 13.7 | 6 | 82.2 | 23.9 | 12.5 | 298.8 | 12.7 | 7.4 | 94.0 |
| Recombination density | y_2 | x_0 |  | y_2 | x_0 |  | y_2 | x_0 |  |
|  | 29.7 | 14.8 | 439.6 | 33.1 | 20 | 662.0 | 33.9 | 15.5 | 525.5 |

| b-structure-3 | | |
|---|---|---|
| y_2 | x_0 | Product |
| 69 | 36.1 | 2490.9 |
| y_2 | x_0 |  |
| 47.9 | 29.1 | 1393.9 |
| y_2 | x_0 |  |
| 80 or more | 43.9 | 3512 or more |

Prior Art

Prior Art

Prior Art

Prior Art

SWITCHING CIRCUIT DEVICE

BACKGROUND OF THE INVENTION

1. Field of the Invention

The invention relates to a switching circuit device and, in particular, a switching circuit device with a greatly improved electrostatic breakdown voltage.

2. Description of the Related Art

Mobile communications equipment such as portable telephones often uses GHz-band microwaves, and in their antenna switching circuits and transmitting and receiving switching circuits, etc., switching elements for switching high-frequencies thereof are often used. As an element thereof, a field-effect transistor (hereinafter referred to as a FET) using gallium arsenide (GaAs) is often employed because high frequencies are used, and accordingly, developments have been made in forming a monolithic microwave integrated circuit (MMIC) by integrating the aforementioned switching circuits themselves.

In FIG. 29A through FIG. 32C, an example of a conventional switching circuit device using GaAs FETs will be described. FIG. 29A shows an example of a theoretical circuit diagram of a compound semiconductor device using GaAs FETs, which is called an SPDT (Single Pole Double Throw).

Sources (or drains) of first and second FET1 and FET2 are connected to a common input terminal IN, and gates of the respective FET1 and FET2 are connected to first and second control terminals Ctl-1 and Ctl-2 via resistors R1 and R2, and drain (or sources) of the respective FETs are connected to first and second output terminals OUT-1 and OUT-2. Signals to be applied to the first and second control terminals Ctl-1 and Ctl-2 are complementary signals, and the FET to which an H-level signal has been applied is turned ON and transmit the signal applied to the input terminal IN to the corresponding output terminal. The resistors R1 and R2 are arranged for the purpose of preventing high-frequency signals from leaking via the gate electrodes to the DC potential of the control terminals Ctl-1 and Ctl-2 which are AC grounded.

FIG. 29B is a plan view of a device in which the above compound semiconductor switch circuit device is integrated.

As shown in the drawing, the FET1 and FET2 (both the gate width of 600 $\mu$m) for switching are arranged in the central parts of a GaAs substrate, and the resistors R1 and R2 are connected to gate electrodes of the respective FETs. In addition, pads I,O1, O2,C1 and C2 corresponding to the common input terminal IN, output terminals OUT-1 and OUT-2, control terminals Ctl-1 and Ctl-2 are provided at the periphery of the substrate. Moreover, second-layer wiring indicated by dotted lines is a gate metal layer (Ti/Pt/Au) 168 formed simultaneously with a gate electrode formation of the respective FETs, and third-layer wiring indicated by solid lines is a pad metal layer (Ti/Pt/Au) 177 for connection of respective elements and a pad formation. An ohmic metal layer (AuGe/Ni/Au), which is in ohmic contact with the first-layer substrate, forms source electrodes and drain electrodes of the respective FETs, and forms electrodes at both ends of the respective resistors, and is not illustrated in FIG. 29 since this overlaps with the pad metal layer.

In a part where each electrode pad and wiring are adjacent, impurity regions 160 and 161 are provided in contact with the whole lower surface or a peripheral part of the electrode pad and wiring. The impurity regions 160 and 161 are provided in a protruding manner from a contact part of the electrode pad or wiring to the substrate and secure a predetermined isolation.

In FIG. 30, a sectional view of a part of an FET of the switching circuit device of FIG. 29B is shown. FET1 and FET2 for a switching operation and FET3 and FET4 as shunt FETs are all of an identical structure, and a source electrode 175 (165), a drain electrode 176 (166), and a gate electrode 169 are arranged in the form of comb teeth in each FET, and illustrated is a set thereof.

As in FIG. 30, on the substrate 151, an operation layer 152 by an n-type ion-implanted layer and, on both sides thereof, $n^+$-type impurity regions to form a source region 156 and a drain region 157 are provided, and on the operation layer 152, a gate electrode 169 is provided, and on the impurity regions, a drain electrode 166 and a source electrode 165 formed of the first-layer ohmic metal layer are provided. Further thereon, provided are a drain electrode 176 and a source electrode 175 formed of the third-layer pad metal layer 177 as described above, whereby wiring for the respective elements is carried out.

As shown in FIG. 30B, a MESFET as typified by the above is small in the capacity of a gate Schottky junction and is the least resistant to electrostatic breakdown when a surge voltage is applied between the gate electrode G to source electrode S or between the gate electrode G and drain electrode D, with its gate electrode G side provided as negative. In this case, static electricity is applied in a reverse-biased manner to a Schottky barrier diode 115 formed at an interface between a channel region 144 and the gate electrode 169 provided on the surface of the channel region 144. In terms of an equivalent circuit, the Schottky barrier diode 115 is connected between the gate electrode G and source electrode S and between the gate electrode G and drain electrode D.

In addition, in FIG. 31A thorough FIG. 32C, an example of a method for manufacturing FETs, pads and wiring of the switching circuit device of FIG. 29B will be shown. Although a description will be herein given of one electrode pad, electrode pads to be connected to the above-described common input terminal, first and second control terminals, and first and second output terminals are all of an identical structure.

The whole surface of a compound semiconductor substrate 151 formed of GaAs or the like is covered with a silicon nitride film 153 through ion implanting having a thickness of approximately 100 Å to 200 Å. Next, GaAs at the outermost periphery of the chip or a predetermined region of the mask is etched to form alignment marks (unillustrated), and a photolithography process is performed to selectively open windows in a resist layer, and an ion implantation of impurity (24 vig$^+$) of p$^-$-type and an ion implantation of impurity (29Si$^+$) of n-type are performed. As a result, a p$^-$-type region 155 and an n-type operation layer 152 are formed on the region 155 in an undoped substrate 151.

Next, the resist layer 154 used in the previous step is removed, a resist layer 158 is newly provided, a photolithography process is performed to selectively open windows, and an ion implantation of impurity (29Si$^+$) of n-type is performed. Thereby, an n$^+$-type source region 156 and drain region 157 are formed, and simultaneously, n$^+$-type regions 160 and 161 are formed on the substrate surface under a predetermined electrode pad 170 and wiring 162. In addition, resistors R1 and R2 of a desirable pattern are also simultaneously formed (FIG. 31A).

Thereby, the wiring 162 and electrode pad 170 and the substrate 151 are separated, and no depletion layer extends to the electrode pad 170 or wiring 162, therefore, the adjacent electrode pad 170 and wiring 162 can be provided at a greatly approximated alienation distance from each other. Thereafter, a silicon nitride film 153 for annealing is deposited at approximately 500 Å, and activation annealing of the ion-implanted p⁻-type region, n-type operation layer and n⁺-type regions is performed.

Thereafter, a photolithography process is performed to selectively open windows in a new resist layer 163, the surface of the source region 156 and drain region 157 is exposed by etching the silicon nitride film at the windows, and three layers of AuGe/Ni/Au to be an ohmic metal layer 164 are evaporated in this order. Thereafter, the resist layer 163 is removed to leave, by lift-off, a first source electrode 165 and a first drain electrode 166 on the source region 156 and drain region 157 in contact. Subsequently, ohmic junctions between the first source electrode 165 and source region 156 and the first drain electrode 166 and drain region 157 are formed by an alloying heat treatment (FIG. 31B).

Next, a photolithography process is performed to selectively open windows in a new resist layer 167, the operation layer 152 in a predetermined gate electrode 169 part is exposed, the substrate 151 in predetermined wiring 162 and predetermined electrode pad 170 parts is exposed, three layers of Ti/Pt/Au are evaporated in this order (FIG. 31C), and thereafter, a gate electrode 169, a first electrode pad 170, and wiring 162 are formed by lift-off (FIG. 31D).

Furthermore, the surface of the substrate 151 is covered with a passivation film formed of a silicon nitride film, a photolithography process is performed on the passivation film to selectively open windows at contact parts with the first source electrode 165, first drain electrode 166, gate electrode 169, and first electrode pad 170, the passivation film in these parts is dry-etched, and a resist layer 171 is removed (FIG. 32A).

Next, a new resist layer 173 is applied to the whole surface of the substrate 151 for a photolithography process, and a photolithography process is performed to selectively open windows in the resist on a predetermined second source electrode 175, a second drain electrode 176, and a second electrode pad 177. Subsequently, three layers of Ti/Pt/Au to be a pad metal layer 174 as a third-layer electrode are evaporated in this order, whereby a second source electrode 175 and second drain electrode 176 and a second electrode pad 177, which are in contact with the first source electrode 165, first drain electrode 166, and first electrode pad 170, are formed (FIG. 32B). Since the other parts of the pad metal layer 174 are deposited onto the resist layer 173, the resist layer 173 is removed to leave only the second source electrode 175, second drain electrode 176, and second electrode pad 177 by lift-off, while the other parts are removed. Herein, since some wiring parts are formed by use of this pad metal layer 174, as a matter of course, the pad metal layer 174 of these wiring parts is left (FIG. 32C), as described in Japanese Patent Application Publication No. 2002-231898.

In recent years, wireless broadband in a 2.4 GHz-band has shown a great expansion. Its transmitting rate is 11 Mbps, which is much greater than the transmitting rate of mobile telephones, and has become popular in ordinary households, for example, ADSL over telephone lines provides wireless service throughout an entire household, or where signals are wirelessly distributed to a cordless liquid crystal television. Recently, a 5 GHz-band has received a special attention as a next-generation wireless broadband, and furthermore, it is anticipated that its outdoor use will soon be approved as a result of a revised legislation and its range of application will be greatly expanded. Compared to the 2.4 GHz band, since the 5 GHz band enables transmitting a larger amount of information at a transmitting rate of 54 Mbps, there is great expectation for sending high-precision moving images without compression, etc., and development of apparatuses and construction of networks for that purpose have been eagerly carried out.

In 5 GHz-band broad band apparatuses, similar to those with a 2.4 GHz band, GaAs switch ICs are used for input/output switching and antenna switching. Since the frequency is twice higher than 2.4 GHz, parasitic capacitance greatly influences deterioration in isolation. As a countermeasure, a means for improving isolation has became indispensable, such as, in a circuit using shunt FETs which have not been used in a 2.4 GHz-band switch IC, for releasing signals leaked to its OFF-side FET to its high frequency GND.

However, since these shunt FETs are narrow in the gate width, they tend to have a low electrostatic breakdown voltage because of small parasitic capacitance.

SUMMARY OF THE INVENTION

The invention provides a switching circuit device that includes a substrate having an insulating region and a first field effect transistor, a second field effect transistor, a third field effect transistor and a fourth field effect transistor. Each of the first, second, third and forth transistors includes a source electrode, a gate electrode and a drain electrode. The device also includes a common input terminal connected to the source electrodes or the drain electrodes of the first and second transistors, a first output terminal connected to the source electrode or the drain electrode of the first transistor, which is not connected to the common input terminal, and connected to the source electrode or the drain electrode of the third transistor, and a second output terminal connected to the source electrode or the drain electrode of the second transistor, which is not connected to the common input terminal, and connected to the source electrode or the drain electrode of the fourth transistor. The device also includes a first control terminal connected to the gate electrodes of the first and fourth transistors, a second control terminal connected to the gate electrodes of the second and third transistors, and a high-frequency ground terminal connected to the source electrodes or the drain electrodes of the third and fourth transistors, which are not connected to the corresponding output terminals. The device also includes a protecting element having a first high concentration impurity region, a second high concentration impurity region and at least part of the insulating region of the substrate. That part of the insulating region is located between the first and second high concentration impurity regions. The protecting element is connected between the first output terminal and the gate electrode of the third transistor or between the second output terminal and the gate electrode of the fourth transistor and is configured to discharge at least partially electrostatic energy of external origin through the protecting element so that the electrostatic energy is reduced enough not to provide an electrostatic breakdown voltage between the gate electrode and the corresponding source or drain electrode of the transistor that is connected to the protecting element.

BRIEF DESCRIPTION OF THE DRAWINGS

FIG. 14A is a sectional view, FIG. 14B is a sectional view, FIG. 14C is a schematic circuit diagram, and FIG. 14D is another schematic circuit diagram of a protecting element of the device of FIG. 13.

DETAILED DESCRIPTION OF THE EMBODIMENTS

Figure 1A:
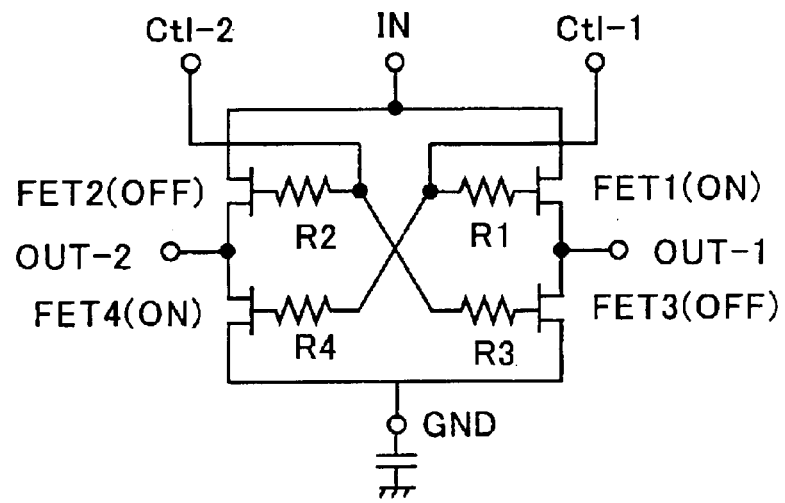
FIGS. 1A and 1B are circuit diagrams of a switching device of a first embodiment of the invention.
Figure 1B:
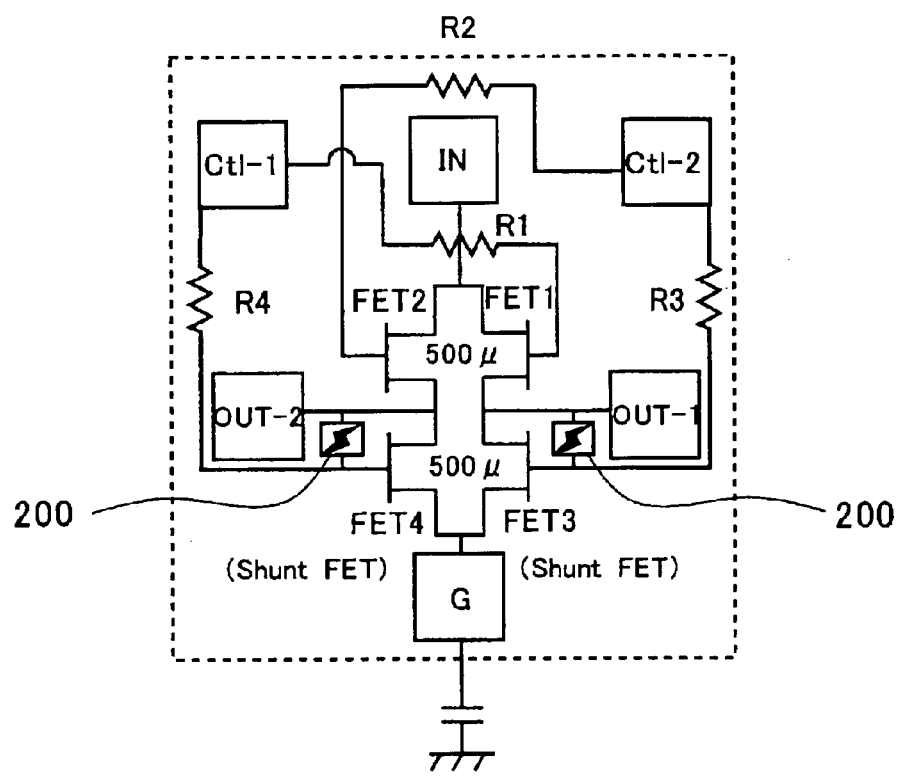

FIG. 1A is an equivalent circuit diagram, and FIG. 1B is a schematic circuit diagram along a chip pattern of a switching device of a first embodiment of the invention.

In 5 GHz-band broadband apparatuses, similar to those with a 2.4 GHz band, GaAs switch ICs are used for input/output switching and antenna switching. Since the frequency is twice higher than 2.4 GHz, parasitic capacitance greatly influences deterioration in isolation. As a countermeasure, to improve isolation shunt FETs, which have not been used in a 2.4 GHz-band switch IC, are used to release signals leaked to its OFF-side FET to its high frequency GND.

In this circuit, shunt FET3 and FET4 are connected between the output terminals OUT-1 and OUT-2 of the FET1 and FET2 for switching and ground, and to gates of these shunt FET3 and FET4, complementary signals of the control terminals Ctl-2 and Ctl-1 to the FET2 and FET1 are applied. As a result, when the FET1 is on, the shunt FET4 is on, and the FET2 and shunt FET3 are off.

In this circuit, when the signal path from the common input terminal IN to the output terminal OUT-1 is turned on and the signal path from the common input terminal IN to the output terminal OUT-2 is turned off, an input signal leak to the output terminal OUT-2 is, since the shunt FET4 is on, released to the ground via a grounded capacitor C, thus isolation can be improved, compared to the conventional devices without shunt FETs.

In this circuit, the control terminal Ctl-1 is connected to the gate electrode of FET1 via a resistor R1, and is connected to the gate electrode of FET4 via a resistor R4. In addition, the control terminal Ctl-2 is connected to the gate electrode of FET2 via a resistor R2, and is connected to the gate electrode of FET3 via a resistor R3. The source electrode (or drain electrode) of shunt FET3 is connected to the output terminal OUT-1, and the source electrode (or drain electrode) of shunt FET4 is connected to the output terminal OUT-2.

In the embodiment of the present invention, a protecting element 200 is connected in parallel between the gate electrode and source electrode (or drain electrode) of shunt FETs, namely, between the output terminal OUT-1 and control terminal Ctl-2 connected to FET3 and between the output terminal OUT-2 and control terminal Ctl-1 connected to FET4.

For protection from electrostatic breakdown, it is sufficient to reduce the electrostatic energy applied to a gate electrode Schottky junction, which is a weak junction. In this embodiment, by connecting a protecting element 200 in parallel between the source (or drain) and gate electrodes of shunt FET3 and FET4 and thereby providing, a path to serve as a bypass for partial discharge of electrostatic energy applied between the corresponding two electrodes. Thus, the weak junction is protected from electrostatic breakdown due to the electrostatic charges induced near the junction by a source extrinsic to the device.

Namely, the electrostatic energy reaching a gate Schottky junction on an FET channel region 44 having the weakest strength against electrostatic breakdown is reduced, whereby the FET3 and FET4 can be protected from electrostatic breakdown.

Figure 2:
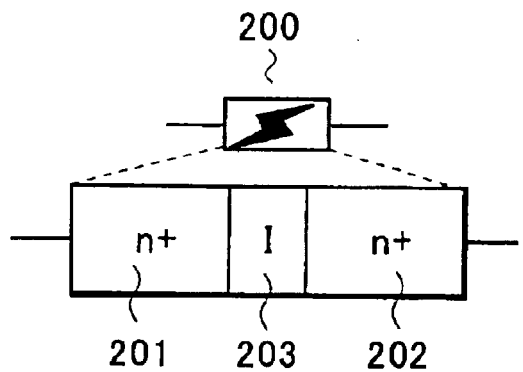
FIG. 2 is a schematic view of a protecting element of the first embodiment.

Herein, the protecting element 200 will be described by use of FIG. 2.

The protecting element 200 is an element in which an insulating region 203 is disposed between a first high concentration impurity region 201 and a second high concentration impurity region 202 that are disposed close to each other. The first and second high concentration impurity regions 201 and 202 are formed by ion implantation or diffusion in a substrate 51. These high concentration impurity regions shall be described hereinafter as first n+-type region 201 and second n+-type region 202. The first and second n+-type regions 201 and 202 are alienated by a distance that enables passage of electrostatic energy, for example, a distance of approximately 4 µm, and for both, the impurity concentration is $1\times10^{17}$ cm$^{-3}$ or more. Insulating region 203 is disposed in contact between first and second n+-type regions 201 and 202. Here, the insulating region 203 is not electrically a complete insulator but is a part of a semi-insulating substrate or an insulating region formed by ion implantation of an impurity into the substrate 51. Insulating region 203 preferably has an impurity concentration of $1\times10^{14}$ cm$^{-3}$ or less and a resistivity of $1\times10^3$ Ω·cm or more.

By disposing n+-type regions 201 and 202 in contact with the respective ends of insulating region 203 and making the distance between the first and second n+-type regions 201 and 202 approximately 4 µm, electrostatic energy, which is applied from the outside between two electrodes of the FET to which the first and second n+-type regions 201 and 202 are respectively connected, can be discharged via insulating region 203.

The distance of 4 µm between these two n+-type regions is a suitable distance for passage of electrostatic energy, and with an distance of 10 µm or more, discharge will not occur reliably between these two n+-type regions. Further, if in the insulating region an impurity concentration is higher than $1\times10^{14}$ cm$^{-3}$, or a resistivity is less than $1\times10^3$ Ω·cm, there will be possibility of a leakage of signal between these two n+-type regions, which will deteriorate the characteristics of the FET.

Under normal FET operation, since a voltage as high as that of static electricity will not be applied, a signal will not pass through the insulating region of 4 µm. Likewise, a signal will not pass through the insulating region of 4 µm even in the case of high-frequency operatio, such as microwave. Thus, under normal operation, the protecting element does not change device characteristics at all since it does not influence the characteristics of the FET in any way. However, static electricity is a phenomenon in which a high voltage is applied instantaneously, and in this case, electrostatic energy passes through the insulating region of 4 µm and is discharged between two n+-type regions. Also, when the thickness of the insulating region becomes 10 µm or more, the resistance becomes large even for static electricity and discharge becomes less likely to occur.

These first n+-type region 201 and second n+-type region 202 are connected in parallel between two electrodes of the FET which constitutes the switch circuit device as a protected element. The first and second n+-type regions 201 and 202 may be used as the terminals of protecting element 200 or metal electrodes 204 may be provided additionally on these n+-type regions.

FIG. 3 show a case where metal electrodes 204 are provided on the protecting element 200. These metal electrodes 204 are connected to bonding pads connected to the electrodes of protected elements FET3 and FET4 or wiring connected to the bonding pads. Herein, as an example, a description will be given in a case where a protecting element 200 and metal electrodes 204 are provided on a semi-insulating substrate 51. That is, although the insulating region 203 of the protecting element 200 is a part of the semi-insulating substrate 51, this embodiment is not limited hereto and the insulating region 203 may be a insulating region implanted with impurities. In this case, regions of the substrate surface which form Schottky junctions with the metal electrodes 204 are also the insulating region implanted with the impurities.

Figure 3A:
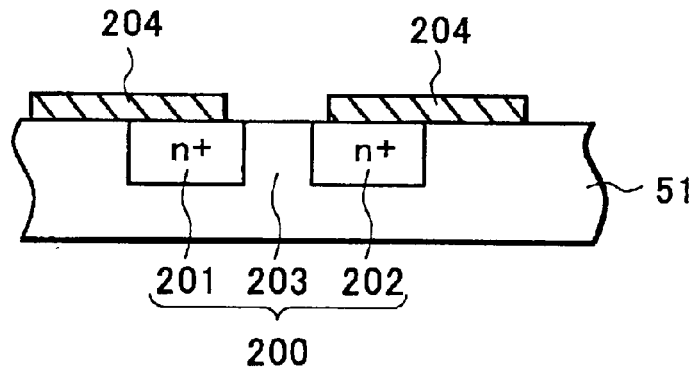
FIGS. 3A and 3B are sectional views of the device of FIG. 2.

In FIG. 3A, metal electrodes 204 form Schottky junctions with the surfaces of first n+-type region 201 and/or second n+-type region 202. The electrodes are formed on the surfaces of first and second n+-type regions 201 and 202 are alienated by 0.1 µm to 5 µm from the insulating region 203 ends in consideration of the mask aligning accuracy and the resistances of both n+-type regions 201 and 202. An alienation of 5 µm or more will make the resistance large and will not readily allow the passage of static electricity. Metal electrodes 204 may be formed on just first and second n+-type regions 201 and 202 or a part thereof may extend to semi-insulating substrate 51 and form a Schottky junction with the substrate surface.

Figure 3B:
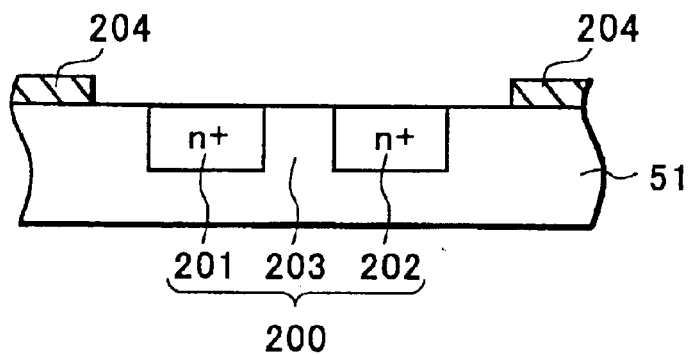

In addition, as in FIG. 3B, a structure may be employed wherein the metal electrode 204 is not in direct contact with the first and/or second n+-type regions 201 and 202 and the metal electrode 204 forms a Schottky junction with the surface 51 positioned approximately 0 µm to 5 µm to the outer side of the end part of the n+-type regions 201 and 202. Namely, as shown in FIG. 3B, the first and second n+-type region 201 and 202 and metal electrodes 204 are not necessarily in contact, and the n+-type regions and metal electrodes 204 can secure a sufficient connection via the semi-insulating substrate if the distance is within 5 µm.

Such a metal electrode 204 may be a part of a bonding pad corresponding to the each terminal of switching circuit device or a part of a wiring connected to a bonding pad which each terminal of switching circuit device connects, and as shall be described in detail later, by using such bonding pads and wiring, the chip area can be prevented from increasing due to the integration of protecting element 200.

Figure 4:
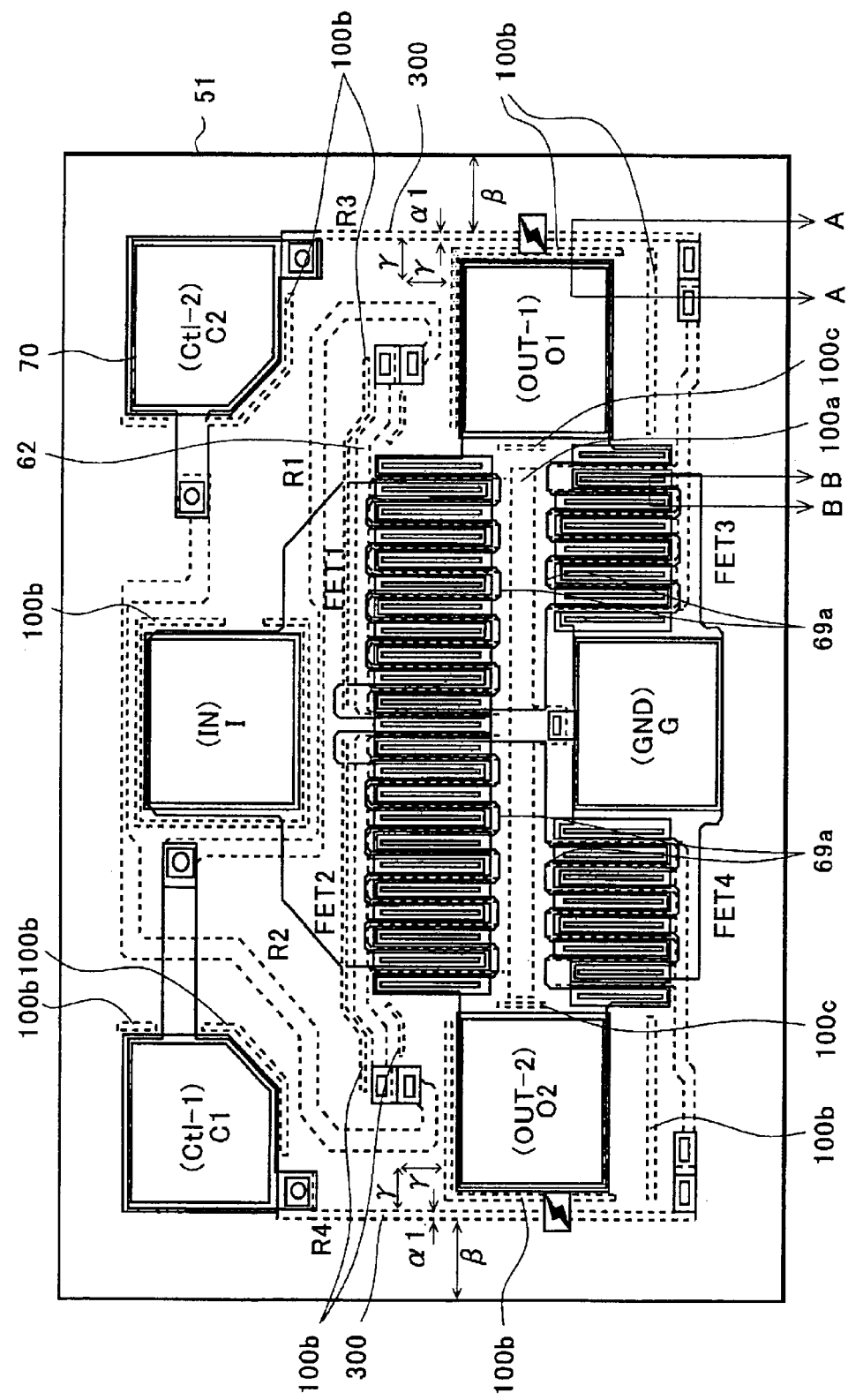
FIG. 4 is plan view of the switching device of the first embodiment.

FIG. 4 is a plan view showing an example of a compound semiconductor switching circuit device where the switching circuit device of FIG. 1 is integrated.

The substrate is, for example, a compound semiconductor substrate 51 (GaAs, for example), and on this substrate, FET1 and FET2 for switching (both have a gate width of 500 µm) are arranged in the left and right central parts, and shunt FET3 and shunt FET4 (both have a gate width of 300 µm) are arranged at lower parts thereof, and the resistors R1, R2, R3, and R4 are connected to gate electrodes of the respective FETs. In addition, electrode pads I, O1, O2, C1, C2, and G corresponding to the common input terminal IN, output terminals OUT-1 and OUT-2, control terminals Ctl-1 and Ctl-2, and ground terminal GND are provided at the periphery of the substrate. The FET1 and FET2 for switching are provided, and furthermore, source electrodes (or drain electrodes) of the shunt FET3 and shunt FET4 are connected to the FET1 and FET2, and drain electrodes (or source electrodes) of the shunt FET3 and shunt FET4 are connected to the electrode pad G corresponding to a high-frequency ground. Although illustration is herein omitted, the electrode pad G is connected to the ground terminal GND via an external capacitor C. Moreover, second-layer wiring indicated by dotted lines is a gate metal layer 68 (Pt/Mo/Ti/Pt/Au) which is formed simultaneously with gate electrode formation of the respective FETs and forms a Schottky junction with the surface of the semi-insulating substrate 51, and third-layer wiring shown by solid lines is a pad metal layer 77 (Ti/Pt/Au) for connection of respective elements and pad formation. An ohmic metal layer (AuGe/Ni/Au), which is in ohmic contact with the substrate, forms source electrodes and drain electrodes of the respective FETs, and forms electrodes at both ends of the respective resistors, and is not illustrated in FIG. 4 since this overlaps with the pad metal layer.

In FIG. 4, for the FET1 (the same applies to the FET2 as well), six-teeth comb shape third-layer pad metal layer 77 extending from the lower side is a source electrode 75 (or a drain electrode) to be connected to the output terminal OUT-1, (OUT-2) and thereunder, a source electrode 65 (or a drain electrode) formed of a first-layer ohmic metal layer exists. In addition, the comb-shaped third-layer pad metal layer 77 extending from the upper side is a drain electrode 76 (or a source electrode) to be connected to the common input terminal IN, and thereunder, a drain electrode 66 (or a source electrode) formed of a first-layer ohmic metal layer exists. These electrodes are arranged in a shape of engaged comb teeth, and a gate electrode 69 formed of a second-layer gate metal layer 68 is arranged therebetween in a comb teeth shape, whereby an FET channel region is constructed.

In addition, for the FET3 as a shunt FET (the same applies to the FET4), four-teeth comb shpae third-layer pad metal layer 77 extending from the lower side is a source electrode 75 (or a drain electrode) to be connected to the ground terminal, and thereunder, a source electrode 65 (or a drain electrode) formed of a first-layer ohmic metal layer exists. In addition, the comb-shaped third-layer pad metal layer 77 extending from the upper side is a drain electrode 76 (or a source electrode) to be connected to the output terminal OUT-1 (Out-2), and thereunder, a drain electrode 66 (or a source electrode) formed of a first-layer ohmic metal layer exists. These both electrodes are arranged in a shape of engaged comb teeth, and a gate electrode 69 formed of a second-layer gate metal layer 68 is arranged therebetween in a comb teeth shape, whereby an FET channel region is constructed.

Furthermore, the control terminal Ctl-1 is connected to the gate electrode of FET1 via a resistor R1, and is connected to the gate electrode of FET4 via the resistor R4. In addition, the control terminal Ctl-2 is connected to the gate electrode of FET2 via a resistor R2, and is connected to the gate electrode of FET3 via a resistor R3. These resistors R1-R4 are n$^+$-type impurity diffused regions, for example, and impurity concentration thereof is $1\times10^{17}$ cm$^{-3}$ or more.

Furthermore, on the substrate surface in the vicinity of the gate electrodes 69 of the respective FETs, an n$^+$-type high concentration impurity region 100a, for example, is provided. In detail, this is a part where the front end part 69a of the comb-shaped gate electrode 69 of the FET1 and the front end part 69a of the comb-shaped gate electrode 69 of the FET2 are at least adjacent to the opposed FET3 and FET4. Herein, the front end part 69a of the gate electrode means a side opposite the base side of the comb structure, and this is a region where the gate electrode 69 is extended from the channel region and forms a Schottky junction with the substrate. A high concentration impurity region 100a is arranged at an alienation distance of 4 μm from the respective gate electrode front end part 69a.

In addition, the high concentration impurity region 100a is also arranged at an alienation distance of 4 μm from the gate electrode front end part 69a of the FET3 and the gate electrode front end part 69a of the FET4 opposed to the FET1 and FET2. Namely, in this embodiment's pattern, the high concentration impurity region 100a is arranged between the FET1 and FET2 for switching operation and FET3 and FET4 as opposed shunt FETs.

By this, the high concentration impurity region 100a, expansion of a depletion layer that extends from the gate electrode 69, which forms a Schottky junction with the substrate, into the substrate can be suppressed. At the metal layer to form a Schottky junction with the substrate, the electric field of the depletion layer that expands to the substrate fluctuates depending on high-frequency signals transmitted by the metal layer, therefore, the high-frequency signals may leak to adjacent electrodes, etc., at which the depletion layer arrives.

However, if the n$^+$-type high concentration impurity region 100a is provided on the surface of the substrate 51 between the FET1 and FET3, and between FET2 and FET4, which are arranged so that the gate electrodes 69 are adjacent, the impurity concentration becomes high (ion type is 29Si$^+$ and the concentration is $1$–$5\times10^{18}$ cm$^{-3}$). The virgin surface of the substrate with no impurities has a resistance of about $1\times10^7$–$1\times10^8$ Ω·cm. Thereby, the gate electrodes 69 of the respective FETs are isolated, and no depletion layer extends to adjacent FETs (impurity regions of the source regions, drain regions, and channel region and gate electrodes), therefore, the adjacent FETs can be provided with a greatly approximated alienation distance from each other.

By providing the high concentration impurity region 100a as such, a depletion layer expanding from the gate electrode of FET1 and FET2 to the substrate is prevented from reaching the gate electrode, source region and drain region, and channel region of the opposed FET3 and FET4 arranged in an adjacent manner, whereby leak of high-frequency signals can be suppressed.

In detail, setting alienation distance from the front end part 69a of the gate electrode 69 to the high-concentration region 100a to 4 μm is sufficient to secure a predetermined isolation.

Similar to R1–R4, impurity concentration of this high concentration impurity region 100a is also $1\times10^{17}$ cm$^{-3}$ or more. In addition, as in FIG. 4, when a part thereof is connected to a bonding pad or a metal layer such as wiring connected to the bonding pad and a DC potential, a GND potential, and a high-frequency GND potential are applied, this is more effective in improving isolation.

In addition, a high concentration impurity region 100b is arranged also in the vicinity of an electrode pad 70 and wiring 62 formed of the gate metal layer 68, which form a Schottky junction with the substrate. Furthermore, a high concentration impurity region 100c is provided also in a region where one FET gate electrode is adjacent to the electrode pad and wiring 62 formed of the gate metal layer 68. Thereby, leak of high-frequency signals due to a depletion layer expanding from the gate electrode 68, electrode pad 70, and wiring 62, which form a Schottky junction with the substrate, into the substrate can be suppressed.

Herein, the high concentration impurity regions 100a–100c are differentiated as symbols only for clarifying the positions where the same structures are arranged, and in this embodiment, these components are completely identical in terms of the effect to improve isolation. Namely, similar to the high concentration impurity region 100a, impurity concentration of the high concentration impurity regions 100b and 100c is $1\times10^{17}$ cm$^{-3}$ or more. In addition, although illustration is omitted, connecting metal electrodes to these high concentration impurity regions 100b and 100c and connecting the metal electrodes to the GND is effective in improvement in isolation.

The protecting element 200 is connected in parallel between the source electrode (or drain electrode) and gate electrode of a shunt FET by utilizing a resistor as an n$^+$-type impurity diffused region and a part of a high concentration impurity region 100.

As described above, in a FET, a Schottky junction part between the gate electrode and operation layer 52 is the lowest in electrostatic breakdown voltage. Namely, when electrostatic energy applied between the gate and drain electrodes or between gate and source electrodes reaches the gate Schottky junction, the gate Schottky junction is damaged if the electrostatic energy exceeds the electrostatic breakdown voltage between the gate electrode and source electrode or between the gate electrode and drain electrode of the channel region.

Herein, since the FET3 side and the FET4 side are symmetrical and completely identical, a description will be given by raising the FET3 side as an example.

As a method for attenuating the electrostatic energy, a method of increasing R3's resistance value can be considered, however, if the R3 is excessively increased, switching time of the switching circuit device becomes excessively great. Therefore, in this embodiment, the electrostatic energy is attenuated by use of the protecting element 200.

Herein, as described above, the resistors R1–R4 are formed of $n^+$-type impurity regions. In the periphery of the respective electrode pad 70, in order to prevent high-frequency signals from leaking from the respective electrode pads 70, a high concentration impurity region 100b is arranged as an isolating measure.

Namely, by arranging the resistor R3 and output terminal pad O1 in an approximated manner to an alienation distance of approximately 4 $\mu$m, the $n^+$-type region to form the resistance R3 and the approximated high concentration impurity region 100b result in a protecting element 200 with a semi-insulating substrate 51 interposed therebetween. Namely, a part of the resistor R3 as a connection means between the control terminal pad C2 and the gate electrode 69 of the FET3 is, for example, a first $n^+$-type region 201, and a part of the high concentration impurity region 100b in the periphery of the output terminal pad O1 is, for example, a second $n^+$-type region 202. In addition, the first $n^+$-type region 201 of the protecting element 200 is connected to the control terminal pad C2, and the second $n^+$-type region 202 is connected to the output terminal pad O1. Namely, this means that the protecting element 200 is connected in parallel between the control terminal Ctl-2 and output terminal OUT-1, that is, between the source and gate electrodes (or between the drain and gate electrode) of the FET3.

By this protecting element 200, electrostatic energy externally applied between the gate electrode and source electrode or between the gate electrode and drain electrode can be discharged between the two $n^+$-type regions 201 and 202 of the protecting element 200. Namely, electrostatic energy to reach between the gate electrode and source electrode or between the gate electrode and drain electrode can be attenuated to an extent not exceeding an electrostatic breakdown voltage between both electrodes. In detail, the electrostatic breakdown voltage between the gate electrode and source electrode or between the gate electrode and drain electrode of the shunt FETs (FET3 and FET4) can be improved by 20V or more compared to that before connection of the protecting element 200, whereby the electrostatic breakdown voltage as a switching circuit device can be made 200V or more.

Herein, although illustration is omitted, the first $n^+$-type region 201 may be connected to a control terminal pad C2 or wiring connected to the control pad C2. In addition, the second $n^+$-type region may be connected to wiring connected to the output terminal pad O1.

In addition, the protecting element 200 is arranged in an approximated manner to the output terminal pad O1 and along one side of the output terminal pad O1. In addition, the protecting element 200 can be connected midway through a path from the control pad C2 which is applied signals to the channel region. Thereby, the electrostatic energy applied between the output terminal OUT-1 and control terminal Ctl-2 of the switching circuit device can be attenuated before reaching between the source electrode (or drain electrode) and gate electrode of the FET3, during the reaching process.

Herein, it is desirable that the distance by which the protecting element 200 is approximated along the pad is 10 $\mu$m or more, because the longer the distance is, the more electrostatic energy can be attenuated.

In FIG. 4, shown is a view wherein the protecting element 200 is arranged along one side of the output terminal pad O1, however, if the resistor R3 is bent and arranged in an L shape along two sides of the output terminal pad O1, this is more effective in attenuating the electrostatic energy as the length of the protecting element 200 to be arranged in a manner approximated to the pad can be prolonged. On the other hand, as in the drawing, if the protecting element 200 is arranged between the output terminal pad O1 and chip scribe line, no reduction in the effective area within the chip due to a connection of the protecting element 200 occurs.

Figure 5:
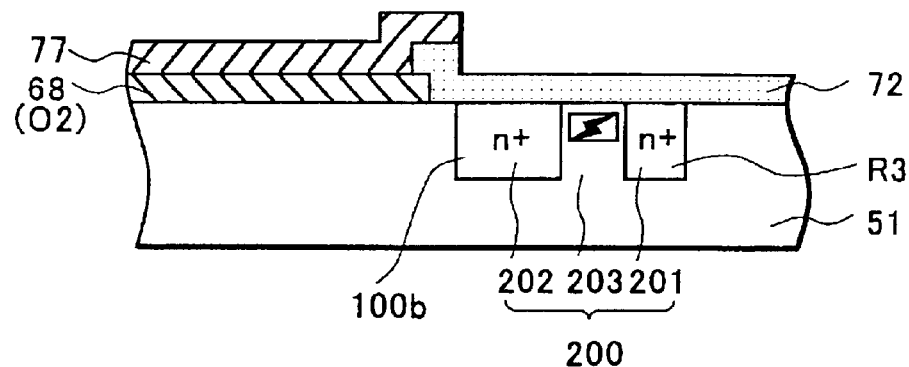
FIG. 5 is a sectional view of the device of FIG. 4.

FIG. 5 shows a sectional view along a line A—A in the vicinity of the electrode pad. Herein, the respective electrode pads of the switching circuit device are all of an identical structure.

As shown in the drawing, the gate metal layer 68 positioned undermost the electrode pad 70 forms a Schottky junction with a GaAs semi-insulating substrate, and a high concentration impurity region 100b and respective electrode pads provided in the vicinity thereof are connected via the substrate 51. Namely, a part of the resistor R3 and a part of the high concentration impurity region 100b to be a third high concentration impurity region form a protecting element 200 with a semi-insulating substrate 51 interposed therebetween, thus resulting in a structure wherein the second $n^+$-type region 202 is connected to the metal electrode 204 via the semi-insulating substrate 51 (insulating region 203). The metal electrode 204 that is alienated 0 $\mu$m to 5 $\mu$m to the outer side from an end part of the high concentration impurity region 100b forms a Schottky junction with a surface of the substrate. Although, in this case, the metal electrode 204 is a part of the output terminal pad O1 formed of the gate metal layer 68, this may be a part of wiring connected to the output terminal pad O1 (see FIG. 3B). Herein, this connection example is merely an example and connection modes as shown in FIG. 3 can be considered.

Figure 6A:
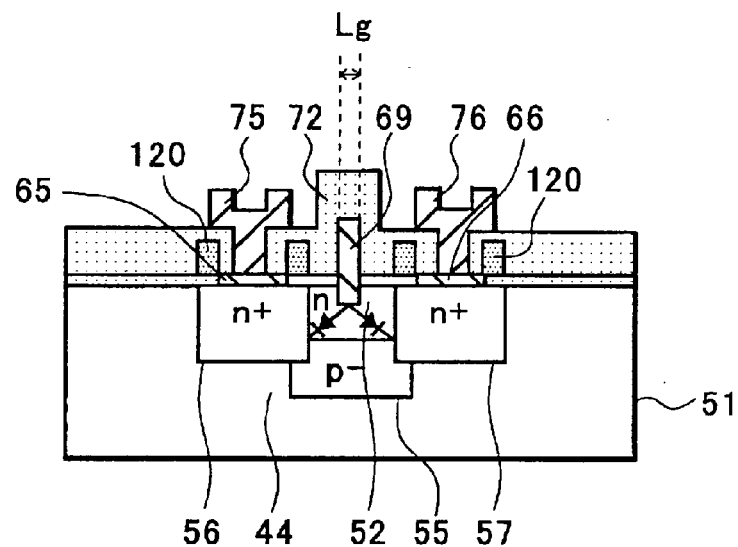
FIG. 6A is a sectional view.

In FIG. 6, a sectional view and a schematic circuit diagram of a part of the switching circuit device of FIG. 4 are shown. FIG. 6A is a sectional view along a line B—B of FIG. 4 and shows an FET set. Herein, the respective electrode pads, FET1 and FET2 for a switching operation, and FET3 and FET4 as shunt FETs, which form a switching circuit device, are all of an identical structure.

As in FIG. 6A, on the substrate 51, an operation layer 52 by an n-type ion-implanted layer and, on both sides thereof, $n^+$-type impurity regions to form a source region 56 and a drain region 57 are provided, and on the operation layer 52, a gate electrode 69 is provided, and on the impurity regions, a drain electrode 66 and a source electrode 65 formed of the first-layer ohmic metal layer are provided. Further thereon, provided are a drain electrode 76 and a source electrode 75 formed of the third-layer pad metal layer 77 as described above, whereby wiring for the respective elements is carried out.

In this embodiment, as in FIG. 4, a protecting element 200 is connected in parallel between the two electrodes of the source electrode S (drain electrode D) and gate electrode G of FET3 (FET4), namely, between the output terminal OUT-1 and control terminal Ctl-2. Thereby, for electrostatic energy applied from between the corresponding two terminals, a path to serve as a bypass to partially discharge the same is formed, therefore, electrostatic energy to be applied to a Schottky junction of FET3's gate electrode 69 as a weak junction can be reduced.

In addition, in this embodiment, in contrast to a conventional FET forming, by Ti, a Schottky junction with the channel region, a gate electrode 69 of this embodiment is provided as a Pt buried gate 69 to increase the saturation current value of the FET and to decrease the ON resistance value. In addition, on a nitride film covering the surroundings of the drain electrode 66 and source electrode 65, an oxide film 120 is provided along the drain electrode 66 and source electrode 65.

These oxide films 120, which will be described later, are required in a step for manufacturing FETs of the embodiment, and in order to improve mask alignment accuracy of the gate electrode 69, these are formed on the n$^+$-type regions to form a source region 56 and a drain region 57 of a FET. In terms of each oxide film 120, which is formed double along the source region 65 and drain region 66 by its manufacturing method, one side face is almost coincident with the end part of the source region 56 or drain region 57, and the other side face is almost coincident with the end part of the source electrode 65 or drain electrode 66. By providing these oxide films 120, mask alignment accuracy is improved and the distance between the source region and the drain region and the distance between the source electrode and the drain electrode are shortened compared to the conventional values. That is, the saturation current value of the FET is increased, and the ON resistance value is decreased.

The length Lg of the gate electrode 69 existing in the channel region 44 (operating layer 52) between the source region 56 and drain region 57 is designed to be 0.5 μm with which no short-channel effect normally occurs. The gate width Wg means a width (the total of comb teeth) of the gate electrode 69 existing in the channel region 44 (operation layer 52) along the source region 56 and drain region 57, and the gate width Wg of FETs for a switching operation is shrunk to 500 μm, which had conventionally been 600 μm. In addition, the gate width Wg of the shunt FETs is 300 μm.

Thus, reduction in the OFF capacitance of FETs by reducing the gate width Wg of the FETs themselves also provides a great effect to improve isolation. However, in general, a reduction in the gate width Wg of the FETs from 600 μm to 50 μm causes a decrease in the saturation current value, resulting in an increase in the ON resistance value. Therefore, in order to maintain the conventional saturation current value and ON resistance value even after a reduction in the gate width Wg, it is necessary to improve the FETs as basic elements in performance. In the embodiment, an FET includes a gate electrode with buried Pt. Conventionally, though, Ti has been used for this purpose.

The gate electrode 69 is a multi-layer deposited metal layer of, from its undermost layer, Pt/Mo/Ti/Pt/Au and has an electrode structure where a part of the Pt layer has been buried. After heat treatment for burying, the part where Pt originally existed on the lower most layer mostly becomes PtGa, and the part where Pt has been diffused in GaAs mostly becomes PtAs$_2$.

As a metal to form a Schottky junction with an channel region of a GaAs FET, since Pt is higher in the barrier height to GaAs than Ti, a high saturation current value and a low ON resistance value are obtained in a Pt buried gate FET compared to a conventional FET that forms a Schottky junction by Ti. Furthermore, in a Pt buried gate FET, by burying a part of the gate electrode in the channel region, the part where current flows immediately under the gate electrode is lowered from the surface of the channel region. Namely, since the channel region has been formed deep beforehand in consideration of a to-be-buried part of the gate electrode so that desirable FET characteristics are obtained, the channel region is designed so that, apart from a natural-surface depletion layer region, current flows through a low resistance region of satisfactory crystals. For the above region as well, the Pt buried gate FET is greatly improved in the saturation current value, the ON resistance value and high-frequency distortion characteristics compared to the Ti gate FET.

Furthermore, compared to the conventional embodiment, FETs of this embodiment are reduced in distance between the source and drain by improving mask alignment accuracy and devising manufacturing processes, and thus are further improved in characteristics as basic elements. However, for that purpose, oxide films 120 for mask alignment are simultaneously formed on the n$^+$-type regions to be a source region 56 and a drain region 57, and a gate electrode 69 is formed by burying the Pt layer. Accordingly, although this will be described later in detail, the peripheral n$^+$-type regions 160 and 161 which are brought into contact with the electrode pad 70 and wiring 62 as shown in the conventional embodiment cannot be formed.

Therefore, in order to suppress expansion of a depletion layer that extends from the gate metal layer 68 to be one electrode pad 70 and wiring 62 on a chip to the substrate, at a part where this gate metal layer 68 and any of FETs, other gate metal layer 68 (other wiring 62 and other electrode pad 70), and the resistors R1–R4 formed of impurity diffused regions are at least adjacent or a part where the gate electrode of one FET, gate metal layer 68, and resistors R1–R4 are at least adjacent, the high concentration impurity regions 100b and 100c, which are not connected to the gate metal layer 68, are provided. Furthermore, by providing the high-concentration region 100a between the approximate FETs, isolation is improved, and the alienation distance between the respective FETs can be greatly reduced.

In addition, by providing mask aligning oxide film 120 for forming FETs, it is sufficient to secure 0.1 μm at maximum for a mask misalignment between the gate electrode 69 and source region 56 or drain region 57. Since 0.2 μm had to conventionally be secured, by the difference of 0.1 μm, the distance between the gate electrode 69 and source region 56 or drain region 57 is reduced. In detail, the distances between the source region 56 or drain region 57, and gate electrode 69 can be reduced from 0.6 μm to 0.5 μm, and furthermore, for the same reason, the distance from the end of the source region 56 to the end of the source electrode 65 and the distance from the end of the drain region 57 to the end of the drain electrode 66 is reduced from 0.4 μm to 0.3 μm.

Namely, mask alignment accuracy of the source region 56 or drain region 57 and gate electrode 69 is improved, and the distances between the source region 56 or drain region 57 and gate electrode 69 are respectively reduced by 0.1 μm respectively. Also mask alignment accuracy between the source region 56 and source electrode 65 and between the drain region 57 and drain electrode 66 is improved, and the distance from the end of the source region 56 to the end of the source electrode 65 and the distance from the end of the drain region 57 to the end of the drain electrode 66 are reduced by 0.1 μm, respectively. Therefore the distance between the source electrode and drain electrode can be reduced by 0.4 μm in total, improvement in the saturation current value and reduction in the ON resistance value can be realized. By combining this effect with the effect of the aforementioned change from the Ti Schottky gate FET to the Pt buried gate FET, even when the gate width Wg of the FET for switching is reduced to 500 μm, conventional saturation current value and ON resistance value can be secured. Thus, this greatly contributes to an improvement in isolation by a gate width Wg reduction.

Furthermore, in order to improve FETs in performance as basic elements, the peripheral n+-type regions 160 and 161, which had been provided under the electrode pad 70 and wiring 62 by its manufacturing processes, cannot be formed, however, by providing the high concentration impurity regions 100b in the vicinity of the electrode pad 70 and wiring 62, conventionally, a predetermined isolation can be secured.

Figure 6B:
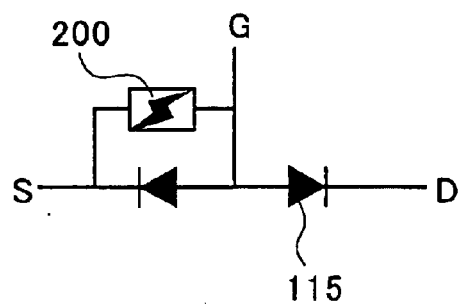
FIG. 6B is a schematic circuit diagram.
Figure 6C:
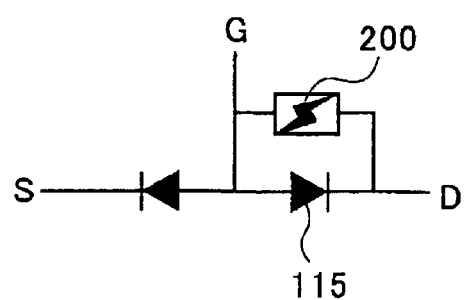
FIG. 6C is a schematic circuit diagram of the device of FIG. 5.

In this embodiment, as in FIGS. 6B and 6C, the protecting element 200 is provided by utilizing these high concentration impurity regions 100b and the resistors R3 and R4, whereby the junction between the source (or drain) electrode and gate electrode of the shunt FET3 and FET4 of a weak junction can be protected. Namely, by utilizing the necessary components of a switching circuit device and moreover without especially securing a space to connect a protecting element 200, the electrostatic breakdown voltage of the switching circuit device is greatly improved.

As described in the above, in this embodiment, the operation layer of the FET is formed by ion implantation, and the gate metal layer 68 forms a Schottky junction with the surface of the semi-insulating substrate 51. For example, when the operation layer of an FET is formed of an epitaxial layer, which is also in the same compound semiconductor, isolation by a region insulated by ion implantation is necessary, and in such a case, the gate metal layer 68 forms a Schottky junction with the insulating region. Impurity concentration of the insulated region is $1\times10^{14}$ cm$^{-3}$ or less, and resistivity is $1\times10^3$ Ω·cm or more. If the FET is formed of an epitaxial layer in this embodiment, a region other than the channel region 44, resistors R1–R4, contact part between the resistor and gate electrode or the resistor and electrode pad, high concentration impurity regions 100, first n+-type region 201, and second n+-type region 202 is an isolating region. Furthermore, isolation by an insulating region by ion implantation is not limited to a isolation by a compound semiconductor, and the same applies to a isolation in a Si semiconductor substrate. Such a part of a semi-insulating substrate and a region insulated by impurity implantation into a substrate are generally referred to as insulating regions.

In addition, although the above-described FETs have been described respectively by raising MESFETs as an example, these may be junction FETs or HEMTs.

Next, a method for manufacturing a semiconductor device of the present invention will be described with reference to FIG. 7 through FIG. 12 by raising the above-described switch circuit device as an example.

Herein, a description will be given of one electrode pad. For example, when a switching circuit device as shown in FIG. 4 is manufactured by the following manufacturing method, an electrode pad for a common input terminal, electrode pads for first and second control terminals, and electrode pads for first and second output terminals are all similarly formed. Moreover, the high concentration impurity regions 100a–100c are made of identical components and are also varied in the arrangement, therefore, these will be hereinafter described as high concentration impurity regions 100.

Figure 7:
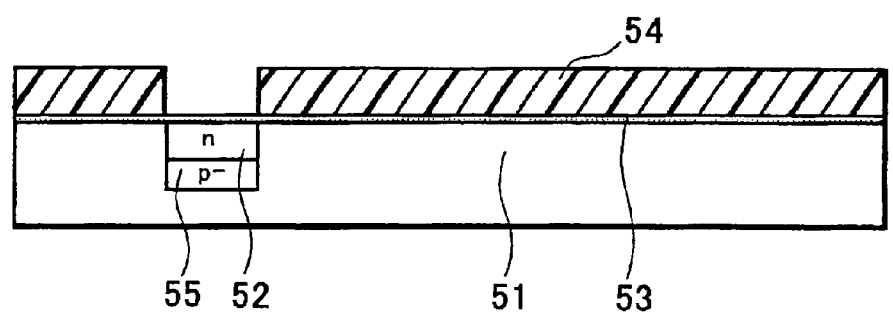
FIGS. 7, 8, 9A, 9B, 10A–10D, 11A–11C and 12A–12C show processing steps of a manufacturing method of the switching device of FIG. 4.

First step: First, as shown in FIG. 7, an operation layer 52 is formed on the surface of a substrate 51.

Namely, the whole surface of a compound semiconductor substrate 51 formed of GaAs or the like is covered with a through ion implanting silicon nitride film 53 having a thickness of approximately 100 Å to 200 Å. Next, GaAs at the outermost of the chip or a predetermined region of the chip is etched to form alignment marks (unillustrated), and a photolithography process is performed to selectively open a window in a resist layer 54 on a predetermined operation layer 52. Thereafter, by use of this resist layer 54 as a mask, an ion implantation of impurity (24Mg+) to give a p−-type and an ion implantation of impurity (29Si+) to give an n-type are performed to form an operation layer for the predetermined operation layer 52. As a result, a p−-type region 55 and, thereon, an n-type operation layer 52 are formed in the un-doped substrate 51. Next, an annealing silicon nitride film for annealing is deposited at approximately 500 Å.

Second step: Next, as shown in FIG. 8, source and drain regions are formed in contact with the operation layer by ion implanting or diffusing one-conductive-type impurities into the substrate surface, and simultaneously, high concentration impurity regions are formed in the vicinity of a region where a gate metal layer to form a Schottky junction with the substrate is provided.

The resist layer 54 used in the previous step is removed, and a photolithography process is newly performed to selectively open windows in a resist layer 58 in the vicinity of a predetermined source region 56 and drain region 57 and a predetermined Schottky metal layer. Since the Schottky metal layer is (hereinafter, referred to as a gate metal layer) is the gate electrode and the lowermost layers of wiring and electrode pad to form a Schottky junction with a semi-insulating substrate, the vicinity of the part of the predetermined wiring 62 and predetermined electrode pad 70 is exposed.

Subsequently, by use of this resist layer 58 as a mask, an ion implantation of impurity (29Si+) to give an n-type is performed for the substrate surface of the predetermined source region 56 and drain region 57 and the predetermined high concentration impurity region 100. Thereby, the n+-type source region 56 and drain region 57 are formed, and simultaneously, high concentration impurity regions 100 are formed. In order to secure a predetermined isolation, the high concentration impurity regions 100 are provided at least at a region where the gate metal layer is adjacent to other gate metal layers or impurity regions. In addition, the high concentration impurity regions 100 are provided on the substrate surface alienated by approximately 4 μm from the end part of the gate metal layer. At the outermost periphery of the chip or at a predetermined region, the resist 58 has been removed for alignment marks for mask alignment in a later step. In addition, not described in drawing, resisters R1–R4 are formed in predetermined region by process of ion implanting or diffusing the same n+-type impurities.

Figure 8:
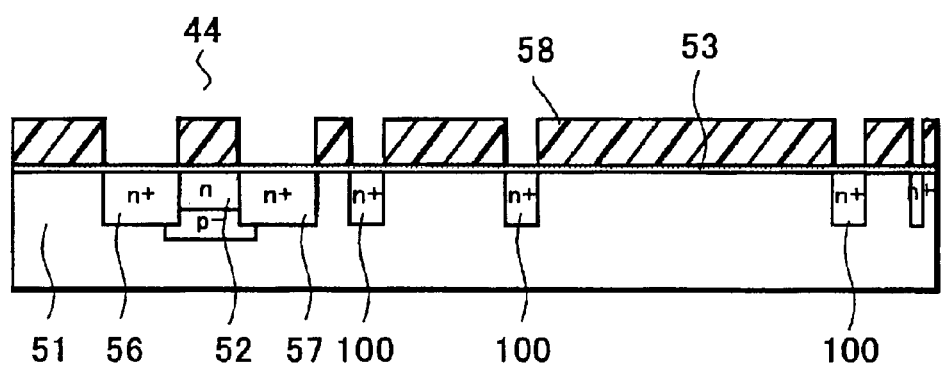

In the sectional view of FIG. 8, shown is a view where high concentration impurity regions 100 are provided in the vicinity of the FET channel region 44, predetermined wiring 62, and predetermined electrode pad layer 70 so as to isolate the same respectively. However, as shown in FIG. 4, these are formed in regions where a gate electrode 69 of an FET is adjacent to another FET (a high concentration impurity region 100a) or in a vicinity of the gate metal layer in regions where the gate metal layer to be the electrode pad 70 and wiring 62 is at least adjacent to any of the FETs, other electrode pads 70 and wiring 62, and the resistors R1–R4 formed of impurity regions (a high concentration impurity region 100b).

Thereby, the approximated resistors R3 or R4 and high concentration impurity region 100b form a protecting element 200 with the semi-insulating substrate 51 interposed therebetween.

Figure 9A:
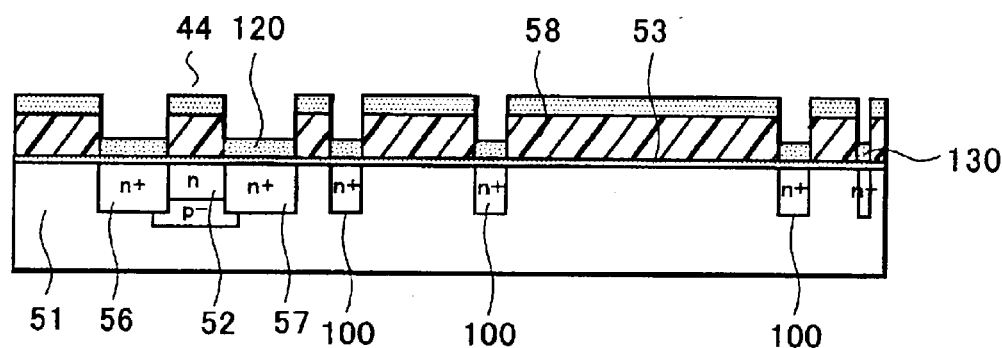
Figure 9B:
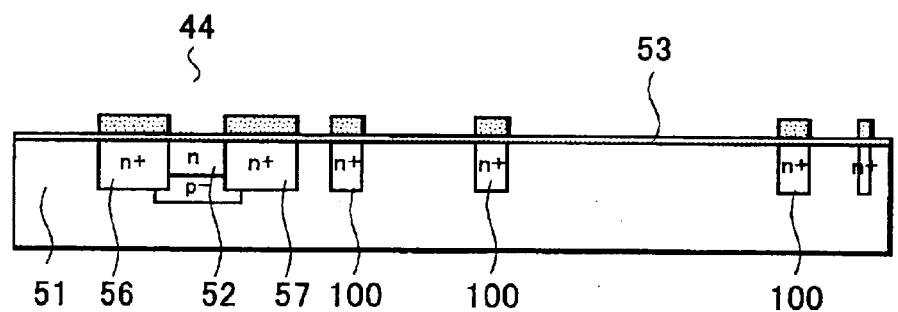

Third step: Next, as shown in FIG. 9, insulating films are formed on the source region and drain region and the high concentration impurity regions. While the resist 58 with which the source region 56, the drain region 57 and the high concentration impurity regions 100 have been formed remains, oxide films 120 are deposited on the whole surface (FIG. 9A). Thereafter, by removing the resist 58 by lift-off, the oxide films 120 are left on the source region 56 and drain region 57 and the high concentration impurity regions 100 (FIG. 9B). And oxide films 120 also remain on the part for alignment marks, and these oxide films 120 are utilized as alignment marks 130 in the following steps. Next, activation annealing is performed for the ion-implanted $p^-$-region, n-type operation layer, $n^+$-type region of source region, drain region, and high concentration impurity regions.

Fourth step: Next, as shown in FIG. 10, first source and first drain electrodes are formed by depositing an ohmic metal layer on the source and drain regions by a photolithography process with mask alignment with the insulating film.

Figure 10A:
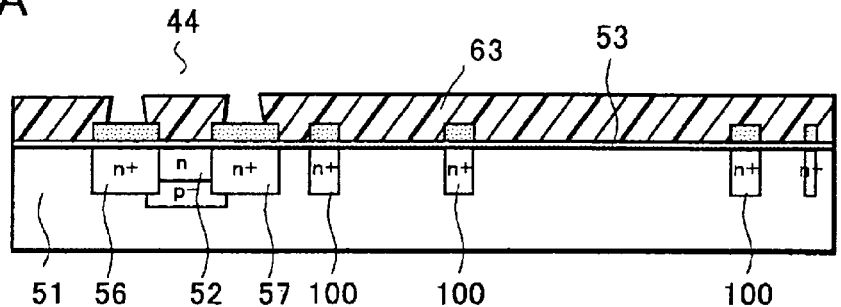
Figure 10B:
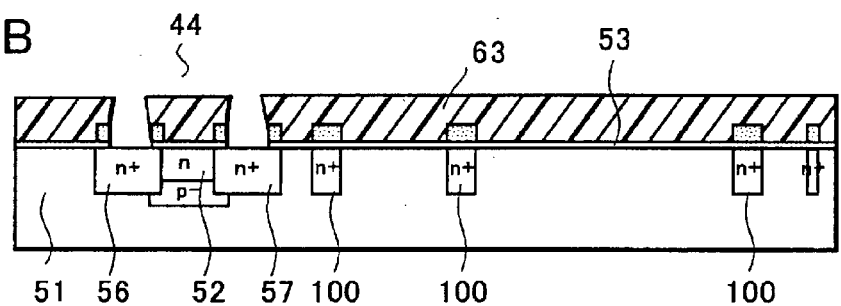
Figure 10C:
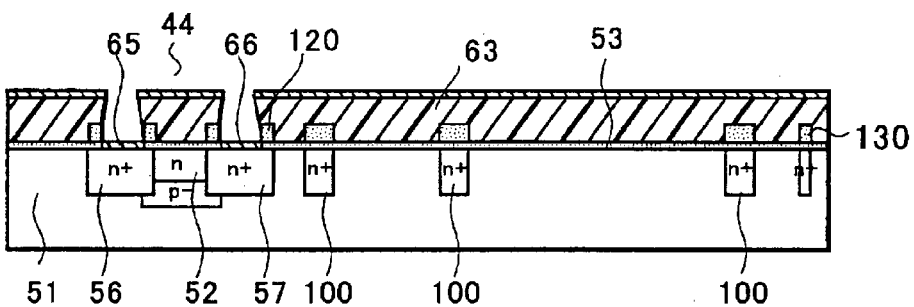
Figure 10D:
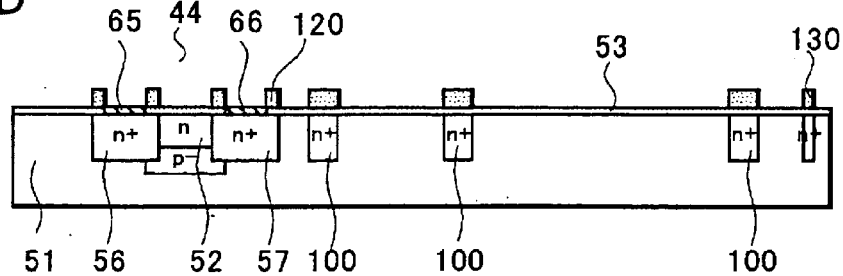

First, a new resist 63 is provided, and a photolithography process is performed to selectively open windows in parts where a predetermined first source electrode 65 and first drain electrode 66 are formed (FIG. 10A). The exposed oxide films 120 and underlying silicon nitride film 53 are removed by $CF_4$ plasma to expose a source region 56 and a drain region 57 (FIG. 10B), and subsequently, three layers of AuGe/Ni/Au to be an ohmic metal layer 64 are evaporated in this order (FIG. 10C). Thereafter, the resist 63 is removed, to leave, by lift-off, the first source electrode 65 and first drain 66 on the source region 56 and drain region 57 in contact. Subsequently, ohmic junctions between the first source electrode 65 and source region 56 and the first drain electrode 66 and drain region 57 are formed by an alloying heat treatment (FIG. 10D).

Conventionally, steps for forming the operation layer 52, source and drain regions 56 and 57, source and drain electrodes 65 and 66 have been performed by use of alignment mark of etched GaAs, and aligning accuracy of the mask aligner is 0.1 µm, therefore, a mask alignment error between the source region 56 and source electrode 65 and between the drain region 57 and drain electrode 66 has resulted in an error of 0.2 µm at maximum. Since the distance between the end of the source region 56 and the end of the source electrode 65 and the distance between the end of the drain region 57 and the end of the drain electrode 66 of 0.2 µm are a limit for preventing the breakdown, an alienation distance of 0.4 µm had to be secured as a design center in consideration of misalignment. However, as in this embodiment, since the source region and drain region and the source electrode and drain electrode can be directly mask-aligned by forming source region 56 and drain region 57 simultaneously while forming alignment marks 130, the distance between the end of the source region 56 and the end of the source electrode 65 and the distance between the end of the drain region 57 to the end of the drain electrode 66 can be reduced. That is, since a mask misalignment between the source region 56 and source electrode 65 and between the drain region 57 and drain electrode 66 can be suppressed to 0.1 µm at maximum, it is sufficient to secure an alienation distance of 0.3 µm as a design center.

Fifth step: Furthermore, as shown in FIG. 11, a gate electrode, a first electrode pad, and wiring are formed by depositing a gate metal layer to form a Schottky junction with the operation layer and the substrate surface by a photolithography process with mask alignment with the insulating film.

Figure 11A:
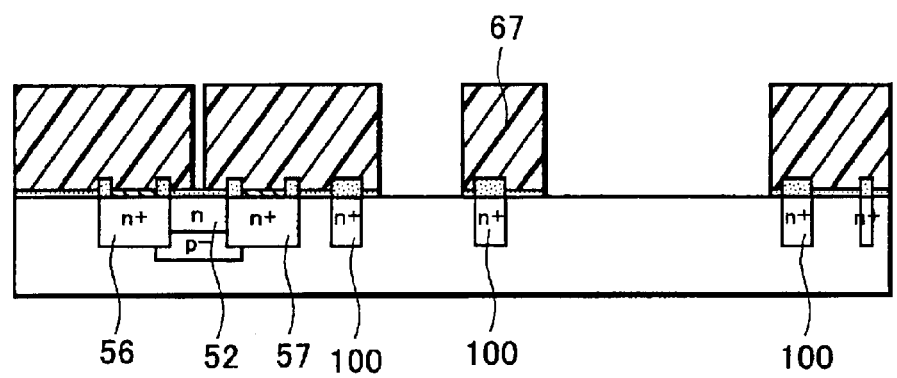

First, in FIG. 11A, a photolithography process is performed to selectively open windows at predetermined gate electrode 69, electrode pad 70 and wiring 62 parts. The silicon nitride film 53 exposed through the predetermined gate electrode 69, electrode pad 70, and wiring 62 parts is dry-etched to expose the operation layer 52 in the predetermined gate electrode 69 part and to expose the substrate 51 in the predetermined wiring 62 and predetermined electrode pad 70 parts. An opening part of the predetermined gate electrode 69 part is provided as 0.5 µm so that a fine gate electrode 69 can be formed.

Figure 11B:
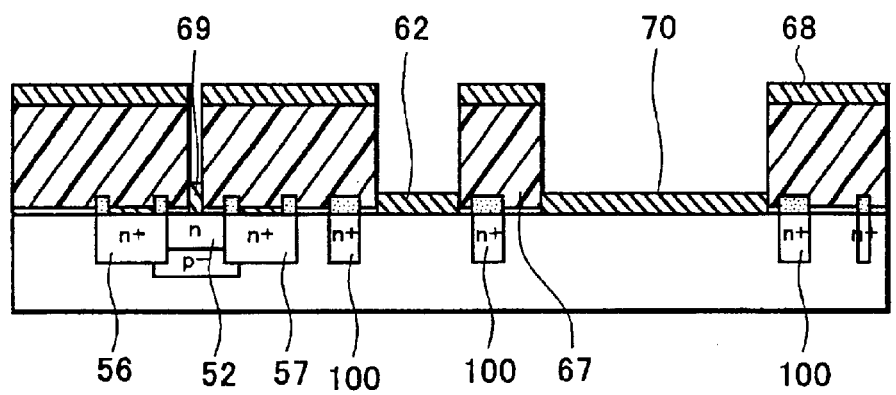

Next, in FIG. 11B, a gate electrode 69, wiring 62, and first electrode pad 70 are formed by depositing a gate metal layer 68 as a second-layer electrode with the operation layer 52 and exposed substrate 51. Namely, five layers of Pt/Mo/Ti/Pt/Au to be a gate metal layer 68 as a second-layer electrode is evaporated in this order on the substrate 51.

Figure 11C:
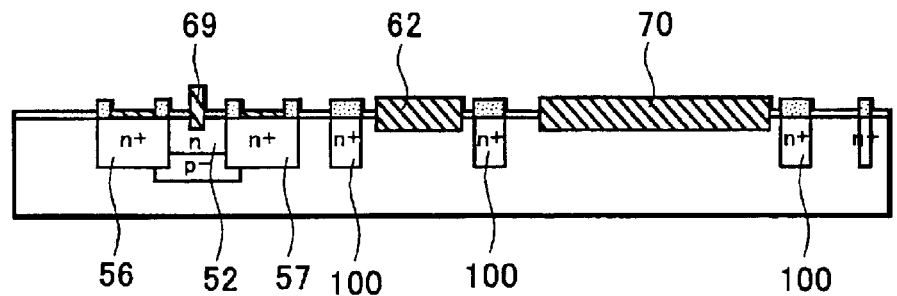

Thereafter, as in FIG. 11C, the resist layer 67 is removed to form, by lift-off, the gate electrode 69 having a gate length of 0.5 µm on in contact with the operation layer 52, first electrode pad 70, and wiring 62, and a heat treatment to bury Pt is applied. Thereby, while the gate electrode 69 maintains a Schottky junction with the substrate, a part thereof is buried in the operation layer 52. Herein, the depth of the operation layer 52 in this case is formed deep in consideration of a to-be-buried part of this gate electrode 69 so that desirable FET characteristics can be obtained.

The surface of the operation layer 52 (for example, approximately 500 Å from the surface) does not allow a current to flow since a natural depletion layer occurs or crystals are uneven in this region, and is therefore not effective as a channel region. By burying a part of the gate electrode 69 into the channel region 52, a part where a current flows immediately under the gate electrode 69 sinks from the surface of the channel region 52. Since the channel region 52 has been formed deep beforehand in consideration of a to-be-buried part of the gate electrode 69 so that desirable FET characteristics are obtained, this region can be effectively utilized as a channel. In detail, there is an advantage such that current density, channel resistance, and high-frequency distortion characteristics are greatly improved.

Herein, the mask for forming a gate electrode 69 also uses the alignment marks 130. Namely, the source and drain regions and gate electrode are directly mask-aligned. Thereby, misalignment between the gate electrode 69 and source region 56 or drain region 57 becomes, in short, equivalent to the alignment accuracy of the mask aligner, and can be suppressed to 0.1 μm at maximum. The gate electrode 69 and source region 56 or drain region 57 has been conventionally indirectly mask-aligned via alignment marks provided by etching GaAs respectively. In this case, since the alignment accuracy of the mask aligner is 0.1 μm, misalignment between the gate electrode 69 and source region 56 or drain region 57 results in 0.2 μm at maximum. On the other hand, a predetermined breakdown voltage cannot be secured unless the source region 56 or drain region 57 and the gate electrode 69 are alienated by 0.4 μm at the minimum. Therefore, conventionally it has been necessary to secure an alienation distance of 0.6 μm as a design center in consideration of manufacturing unevenness due to mask alignment error, however, according to this embodiment, it is sufficient to secure 0.5 μm at a design center.

Herein, the oxide films 120 are also formed on the high concentration impurity regions 100 formed simultaneously with the source region 56 and drain region 57. Namely, if high concentration impurity regions 100 to improve isolation are formed on the whole surface (or the peripheral part) under the electrode pad 70 or wiring 62, gate metal layers 68 are deposited on the oxide films 120. In particular, in order to improve FET basic performance in the embodiment, the gate electrode 69 is formed by burying Pt. Namely, although Pt is to be arranged on the oxide films 120, the oxide films 120 and Pt have weak adhering strength, therefore, a problem of peeling of the gate metal layer 68 from the oxide film 120 occurs.

Therefore, as in FIG. 5 and FIG. 11C, without being brought into contact with the electrode pad 70 or wiring 62, the high concentration impurity region 100 is arranged between the gate metal layer and adjacent other gate metal layers, FETs, or impurity regions. Thereby, a depletion layer that expands from the gate metal layer to the substrate is prevented from reaching the adjacent other gate metal layer, FET, or impurity region.

Namely, this is a manufacturing method which can improve the basic performance of FETs, and moreover, expansion of the depletion layer from the gate metal layer to construct the electrode pad 70 and wiring 62 can be suppressed by the high concentration impurity region 100 provided in the vicinity, thus a leak of high-frequency signals can be prevented.

Seventh step: Furthermore, second source, second drain electrodes and a second electrode pad are formed by depositing a pad metal layer as a third-layer electrode onto the first source, first drain electrodes and the first electrode pad.

Figure 12A:
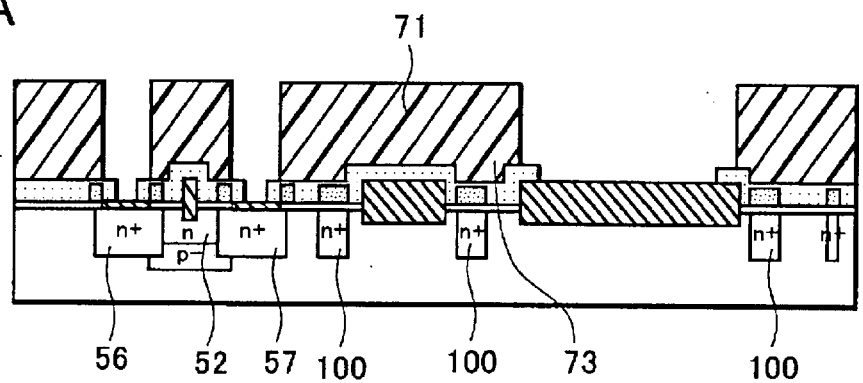

After forming the gate electrode 69, wiring 62, and first electrode pad 70, in order to protect the operation layer 52 around the gate electrode 69, the surface of the substrate 51 is covered with a passivation film 72 of a silicon nitride film. A photolithography process is performed on this passivation film 72 to selectively open windows in the resist at contact parts with the first source electrode 65, first drain electrode 66, gate electrode 69, and first electrode pad 70, and the passivation film 72 at these parts is dry-etched. Thereafter, the resist layer 71 is removed (FIG. 12A).

Figure 12B:
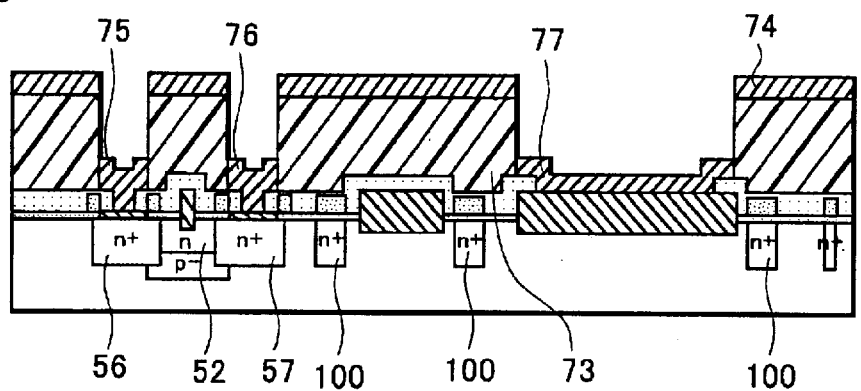
Figure 12C:
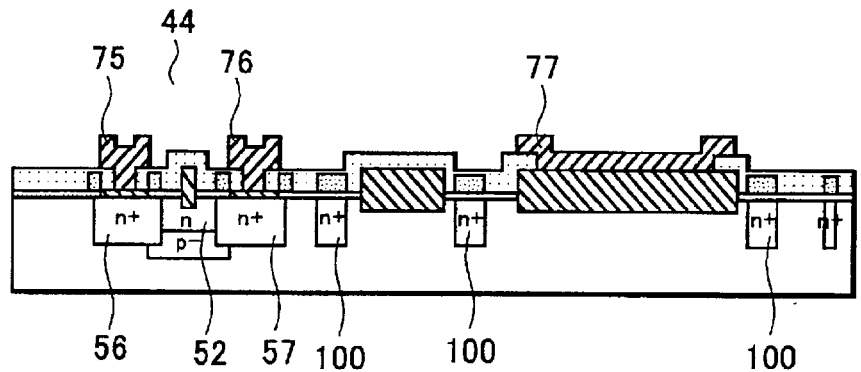

Furthermore, a new resist layer 73 is applied to the whole surface of the substrate 51, and a photolithography process is performed to selectively open windows in the resist on the predetermined second source electrode 75 and second drain electrode 76 and the second electrode pad 77. Subsequently, three layers of Ti/Pt/Au to be a pad metal layer 74 as a third-layer electrode are evaporated in this order, whereby a second source electrode 75, a second drain electrode 76, and a second electrode pad 77 which is in contact with the first source electrode 65, first drain electrode 66, and first electrode pad 70 are formed (FIG. 12B). Since the other parts of the pad metal layer 74 are deposited onto the resist layer 73, the resist layer 73 is removed to remain, by lift-off, only the second source electrode 75, second drain electrode 76, and second electrode pad 77, while the other parts are removed. Herein, since some wiring parts are formed by use of this pad metal layer 74, as a matter of course, the pad metal layer 74 of these wiring parts is left (FIG. 12C).

Herein, the arrangement example of the high concentration impurity regions 100 is merely an example, and any arrangement can be employed as long as high-frequency signals applied to the gate metal layer 68 to form a Schottky junction with the substrate are prevented from being transmitted via the substrate 51 to another gate metal layer 68.

Figure 13:
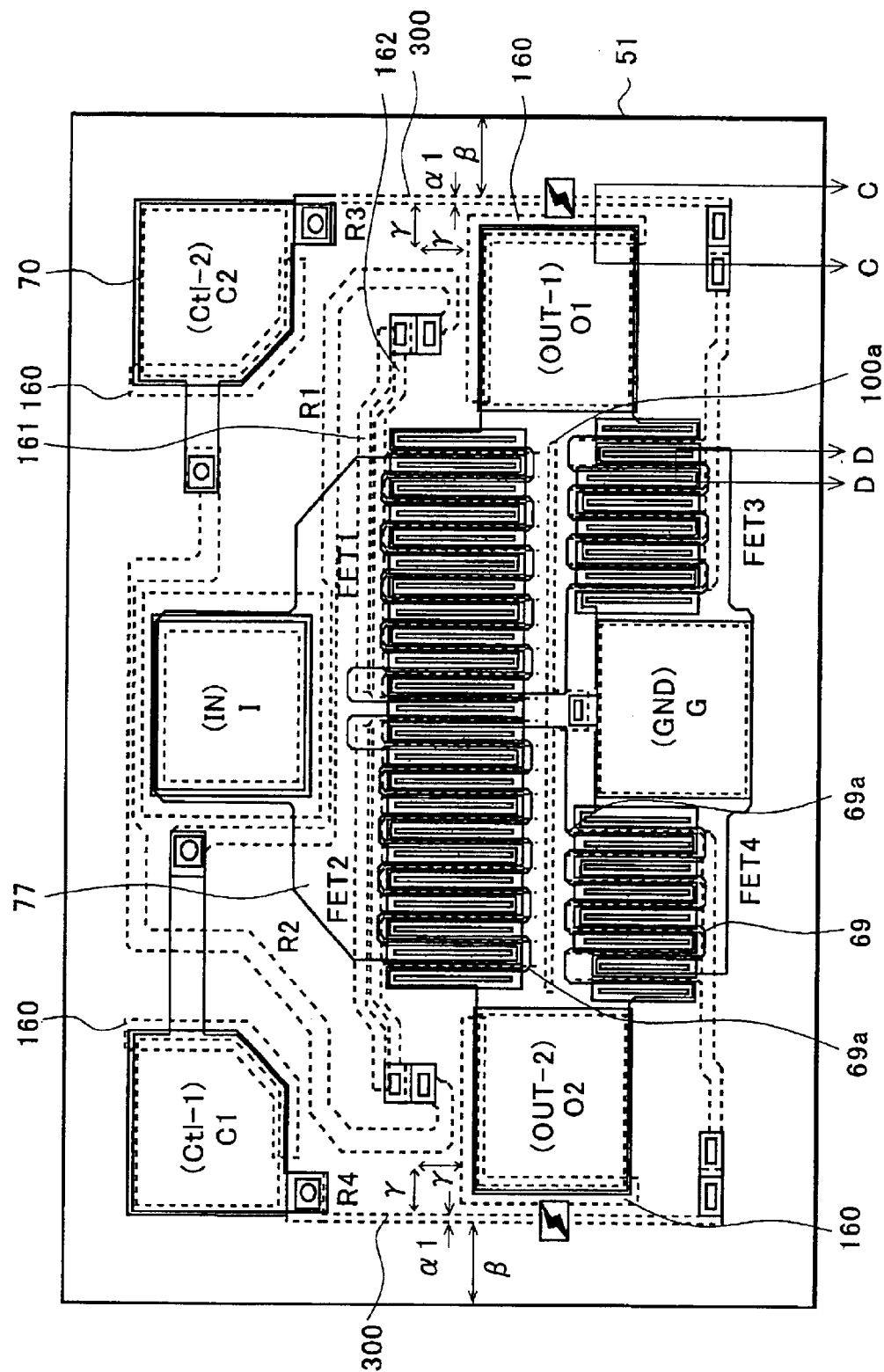
FIG. 13 is a plan view of a switching device of a second embodiment of the invention.
Figure 32A:
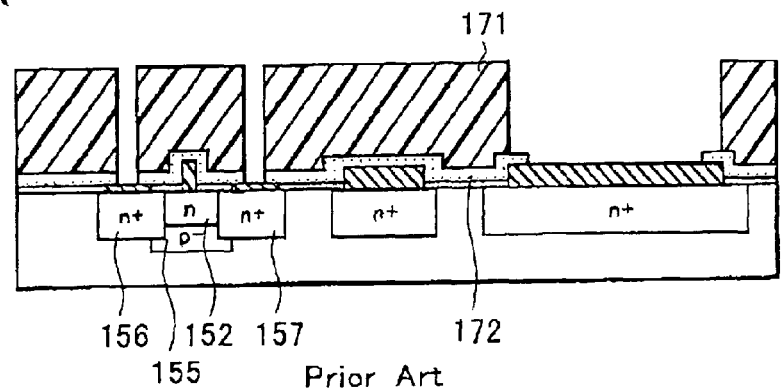
Figure 32B:
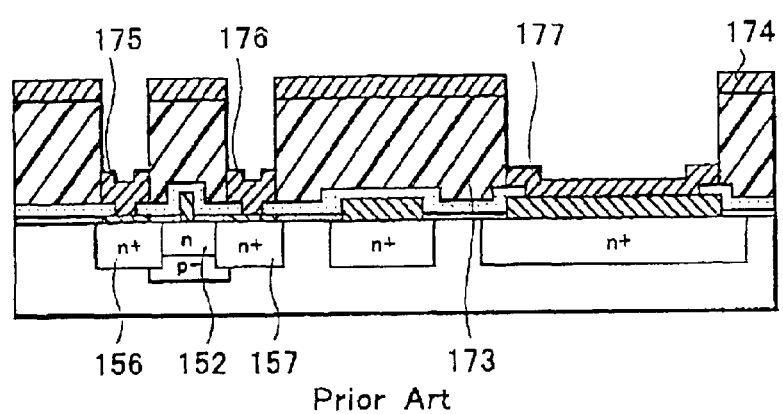
Figure 32C:
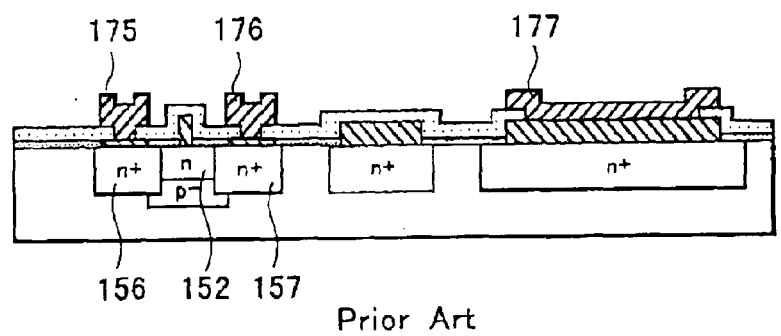

In addition, a second embodiment will be shown by use of FIG. 13 and FIG. 14. The embodiment is an example of a switching circuit device where FETs formed by a conventional manufacturing method (see FIG. 31 and FIG. 32) have been integrated.

Namely, mask alignment by oxide film 120 is not performed, but alignment marks are formed by etching the GaAs substrate 51 at the outermost of the chip or a predetermined region of the mask, and all photolithography masks are aligned with the marks.

In this case, since no oxide film 120 is formed, at the periphery of an electrode pad 70, a peripheral n$^+$-type region 160 of a third high concentration impurity regions to form a Schottky junction with the pad can be formed. Namely, a protecting element 200 is constructed by a part of a peripheral n$^+$-type region 160, a resistor R3 (R4), and a semi-insulating substrate therebetween.

Moreover, this peripheral n$^+$-type region 160 is, in FIG. 13, provided at the periphery of the electrode pad 70 in a partially overlapping manner with the electrode pad 70, however, the region 160 may also be provided below the electrode pad 70 so as to overlap with the electrode pad 70 and protrude from the electrode pad 70.

Alternatively, the region 160 may be provided at the periphery of wiring connected to the electrode pad 70 in a partially overlapping manner, or may be provided below wiring so as to overlap with the wiring and protrude from the wiring.

In FIG. 14, a sectional view in the vicinity of a pad along a line C—C (FIG. 14A), a sectional view of an FET along a line D—D (FIG. 14B), and a schematic circuit diagram of an FET (FIG. 14C) are shown.

As in FIG. 14A, a gate metal layer 68 positioned undermost the output terminal pad O1 (O2) forms a Schottky junction with a GaAs semi-insulating substrate, and a second n$^+$-type region 202 as a part of the peripheral n$^+$-type region 160 is arranged in contact with the gate metal layer 68 to form a Schottky junction. Namely, a part of the resistor R3 (R4) and a part of the peripheral n$^+$-type region 160 form a protecting element 200 with the semi-insulating substrate 51 interposed therebetween, and the second n$^+$-type region 202 is connected to a metal electrode (see FIG. 3A).

FIG. 14B shows a sectional view along a line D—D of FIG. 13. Herein, the respective electrode pads, FET1 and FET2 for a switching operation, and FET3 and FET4 as shunt FETs, which form a switching circuit device, are all of an identical structure.

As illustrated, on the substrate 51, an operation layer 52 of an n-type ion-implanted layer and, on both sides thereof, n$^+$-type impurity regions to form a source region 56 and a drain region 57 are provided, and on the operation layer 52, a gate electrode 69 is provided, and on the impurity regions, a drain electrode 66 and a source electrode 65 formed of a first-layer ohmic metal layer are provided. Further thereon, a drain electrode 76 and a source electrode 75 formed of a third-layer pad metal layer 77 are provided as mentioned above, whereby wiring for the respective elements is carried out. The operation layer 52 and gate electrode 69 form a Schottky junction by Ti.

In the embodiment, as in FIGS. 14C and 14D, a protecting element 200 is connected in parallel between the source electrode S (or drain electrode D) of FET3 (FET4) and gate electrode G, namely, between the output terminal OUT-1 and control terminal Ctl-2. Thereby, for electrostatic energy applied between the corresponding two electrodes, a path to serve as a bypass to partially discharge the same is formed, therefore, electrostatic energy to be applied to a Schottky junction of FET3's gate electrode 69 as a weak junction can be reduced.

The shape and connection position of protecting element 200 shall now be described further. Since it is considered that when static electricity is applied to protecting element 200, an electrostatic current is generated, the protection effect can be improved by making a larger amount of electrostatic current flow through protecting element 200. That is, the shape and connection position of protecting element 200 should be considered towards making a larger amount of electrostatic current flow through protecting element 200.

As described above, the embodiment's protecting element has a structure wherein a first $n^+$-type region 201 and a second $n^+$-type region 202 are disposed in opposing manner and an insulating region 203 is disposed at the periphery of both regions.

Figure 15:
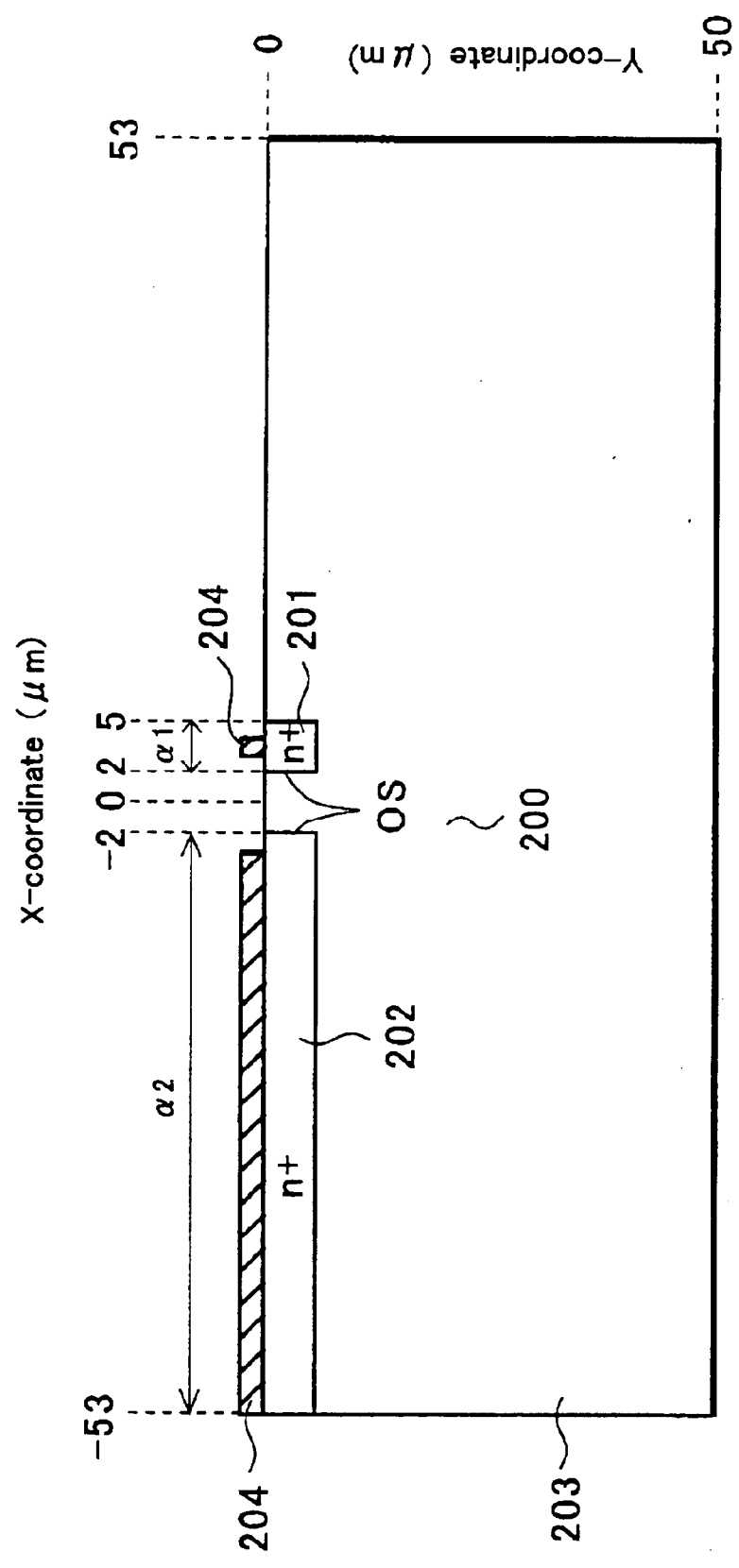
FIG. 15 is a cross-sectional model diagram of a device simulation for the protecting element.

As shown in FIG. 15, the $n^+$-type region 201 has one side surface that opposes the second $n^+$-type region 202 and a side surface at the opposite side. Likewise, the second $n^+$-type region 202 also has one side surface that opposes the first $n^+$-type region 201 and a side surface at the opposite side. The side surface at the side at which the two regions oppose each other shall be referred to as the opposing surface OS.

In addition, this embodiment's second $n^+$-type region 202 is not restricted to a single diffusion region. That is, all high concentration impurity regions, which are disposed so as to oppose first $n^+$-type region 201 and is used for the discharge of electrostatic energy, are referred to inclusively. That is, as long as it is disposed so as to oppose a single first $n^+$-type region 201, second $n^+$-type region 202 may be arranged from a single impurity diffusion region or may be a set of a plurality of partitioned impurity regions.

Also, in a case where second $n^+$-type region 202 is partitioned into a plurality of types, the partitioned parts do not have to be directly continuous and may be discontinuous. That is, with second $n^+$-type regions 202 that are connected to the same terminal of the same protected element and are opposed to a first $n^+$-type region 201 in common, in a case where metal electrodes are disposed on second $n^+$-type regions 202, differences may exist in the impurity concentration as long as adequately high impurity concentrations can be maintained with which the protecting element itself will not be broken due to a depletion layer, resulting from a voltage due to static electricity, reaching a metal electrode. Also, even if such regions have differences in impurity concentration, differences in size, differences in shape, and several other types of differences, these shall be referred to inclusively as second $n^+$-type region 202.

Likewise, first $n^+$-type regions 201 that are connected to the same terminal of the same protected element and are opposed to a second $n^+$-type region 202 in common shall be referred to inclusively as first $n^+$-type region 201 even if there are such differences in impurity concentration, differences in size, differences in shape, and several other types of differences.

Also, although a part of a GaAs substrate 51 shall be described as an example of insulating region 203 below, an insulated region, which has been insulated by ion implantation of an impurity into a substrate, may be applied in the same manner.

FIG. 15 shows a cross-sectional model of a device simulation of the voltage-current characteristics of a protecting element 200 by an ISE TCAD (TCAD made by ISE Corp.). Protecting element 200 is formed by forming first $n^+$-type region 201 and second $n^+$-type region 202 by performing ion implantation into a 50 μm-thick GaAs semi-insulating substrate at a dosage of $5 \times 13$ cm$^{-2}$ and an acceleration voltage of 90 KeV and then annealing. That is, with this structure, all of the interval between first $n^+$-type region 201 and second $n^+$-type region 202 and the periphery of the two regions become insulating region 203.

As shown in FIG. 15 with first $n^+$-type region 201, the width α1 in the direction being alienated from the opposing surfaces OS of the two regions is made approximately 5 μm or less and, more specifically, 3 μm. Although the narrower α1 is, the better, a width of 0.1 μm or more is necessary as a limit at which the arrangement will function as a protecting element. Also although with this embodiment, the first $n^+$-type region 201 is disposed parallel to and is alienated from second $n^+$-type region 202 by approximately 4 μm, in planar pattern, the tip of the first $n^+$-type region 201 may be made a pointed shape to facilitate discharge, in other words, the pattern may be one with which the distance with respect to second $n^+$-type region 202 varies. The grounds for setting α1 to 5 μm or less shall be described later.

As shown in FIG. 15, metal electrodes 204 are connected to first $n^+$-type region 201 and second $n^+$-type region 202. The methods illustrated in FIG. 3A and FIG. 3B may be considered as methods of connecting metal electrodes 204 to the first and second $n^+$-type regions.

Second $n^+$-type region 202 is, for example, a diffusion region disposed below a electrode pad and its width α2 is made 51 μm. With each of the first and second $n^+$-type regions, metal electrode 204 is disposed 1 μm to the inner side from edge of $n^+$-type regions. The perspective depth, which is the device size (for example, the gate width in the case of an FET), is set to 1 μm.

Here, a simulation was performed in which first $n^+$-type region 201 is made the positive side, second $n^+$-type region 202 is made the negative side, and a current of 1A is made to flow, assuming the application of an electrostatic voltage of 700V at 220 pF and 0 Ω.

Figure 16:
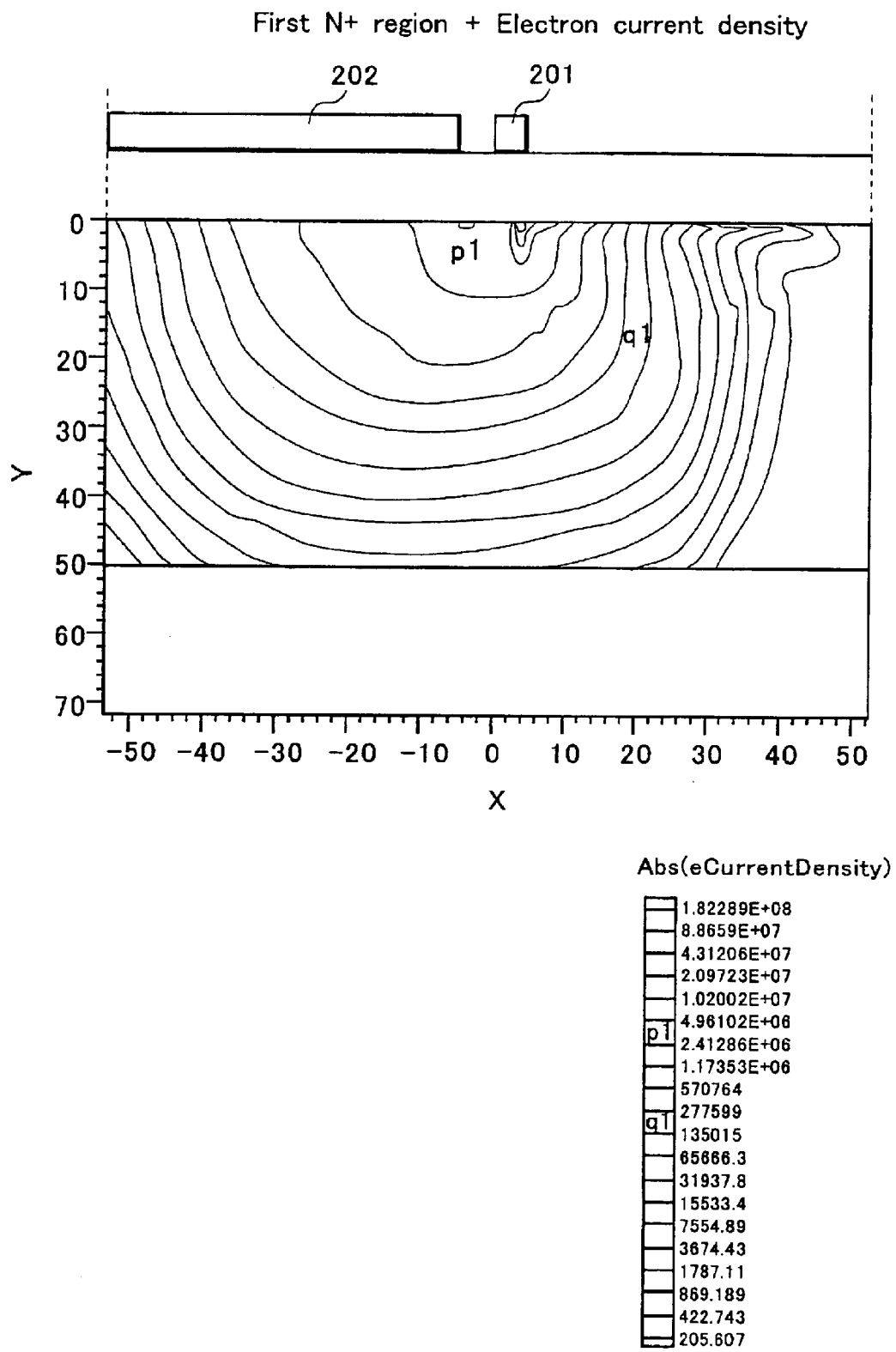
FIG. 16 is an electron current density distribution diagram of the device simulation.
Figure 17:
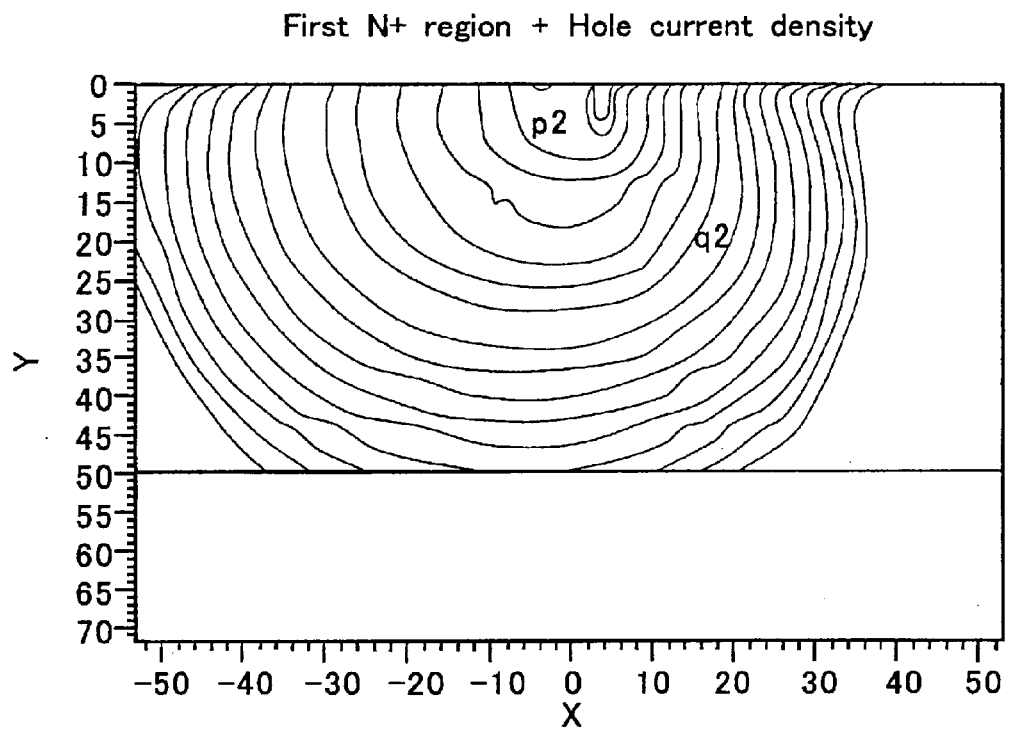
FIG. 17 is a hole current density distribution diagram of the device simulation.
Figure 17:
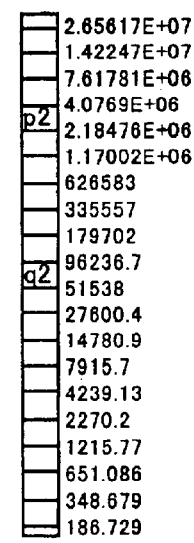
Figure 18:
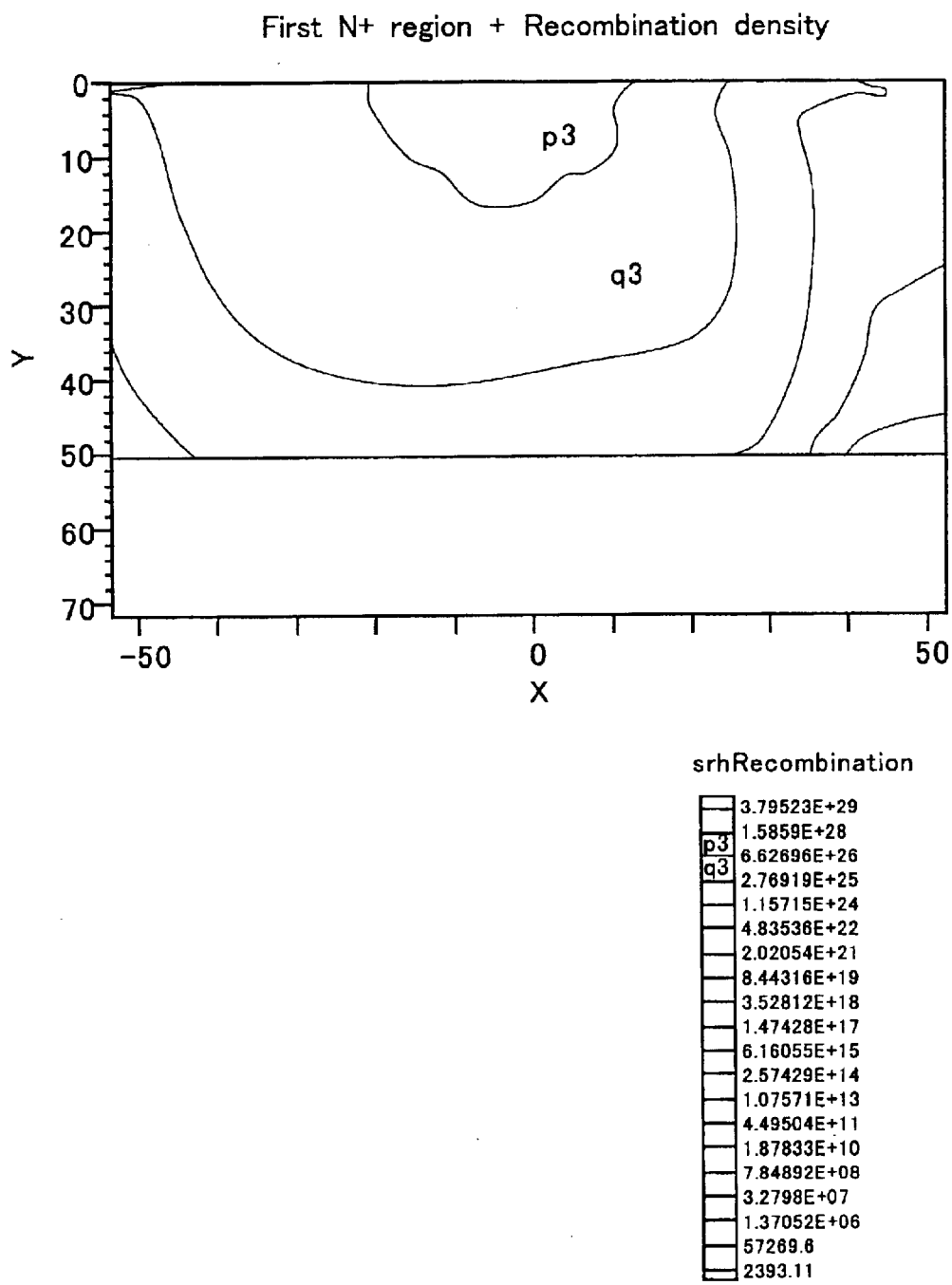
FIG. 18 is a recombination density distribution diagram of the device simulation.

FIG. 16, FIG. 17, and FIG. 18 respectively show the electron current density, hole current density, and recombination density distributions resulting from the simulation. In all cases, the values are indicated in units of cm$^{-3}$. In FIG. 16, the cross-sectional model illustrated in FIG. 15 is overlaid at the upper part.

With the electron current density distribution of FIG. 16, the p1 region is the region of highest density among the regions that span both first $n^+$-type region 201 and second $n^+$-type region 202. Although the total current is the current resulting from summing the electron current and the hole current, since the electron current is by far greater than the hole current, the electron current is taken as representing the current, and with this embodiment, the part of the first and second n$^+$-type regions and the substrate being surrounded by q1 region including q1 region, at which the electron current density becomes approximately 10% that of p1, is defined as a current path of protecting element 200. The reason for the above definition is because a region at which the current density is less than that of q1 was considered as not affecting the operation.

As is clear from FIG. 16, due to the width of α1 being narrow, a large amount of current flows around the side surface at the side opposite opposing surface OS of first n$^+$-type region 201. It is considered that this wrap-around current will occur in likewise manner when static electricity is applied.

The q1 region at the outer side of first n$^+$-type region 201 is located at approximately 20 μm on the X-axis at a location furthest from first n$^+$-type region 201. The X-coordinate of the outer side end of first n$^+$-type region 201 is 5 μm as shown in FIG. 15 and at parts up to 15 μm at the outer side of first n$^+$-type region 201, flows approximately 10% or more of the electron current of the region of highest electron current density that spans across both first n$^+$-type region 201 and second n$^+$ region 202.

The hole current shown in FIG. 17 likewise exhibits a wrap-around at the outer side of first n$^+$-type region 201. With this hole current density distribution, the hole current density of a q2, region near the X-coordinate of 20 μm is approximately 2% of the hole current density of the p2 region of the highest hole current density that spans across both first n$^+$-type region 201 and second n$^+$-type region 202.

The recombination shown in FIG. 18 likewise also exhibits a wrap-around at the outer side of first n$^+$-type region 201. With the recombination density distribution of FIG. 18, the recombination density of a q3 region near the X-coordinate of 20 μm is approximately 10% of the recombination density of the p3 region of the highest recombination density that spans across both first n$^+$-type region 201 and second n$^+$-type region 202.

Figure 19A:
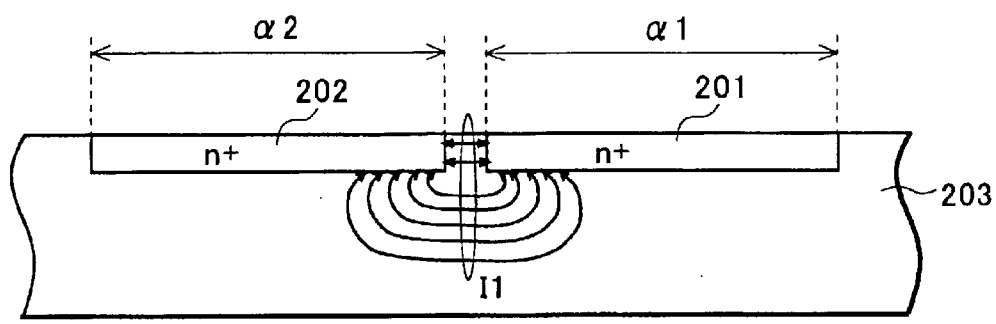
FIG. 19A is a schematic diagram of the current path of a a-structure and FIG. 19B is a schematic diagram of the current paths of a b-structure.
Figure 19B:
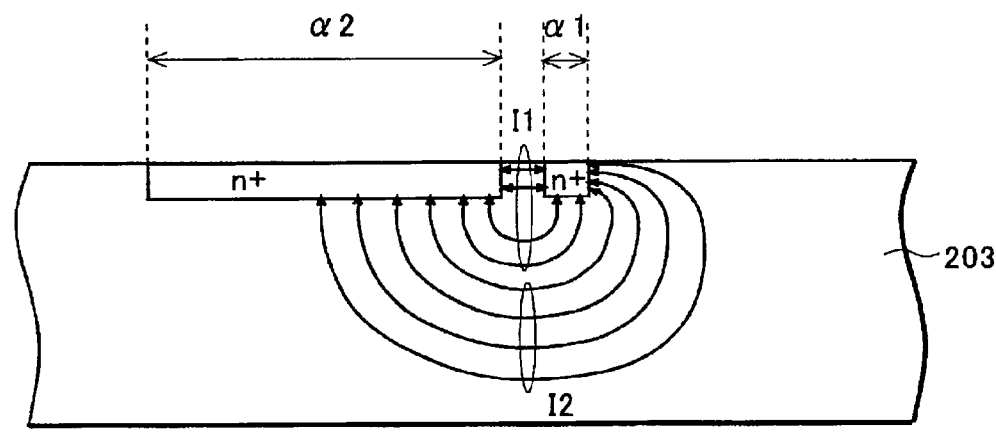

FIG. 19 show schematic diagrams of current paths formed in insulating region 203 at the periphery of first n$^+$-type region 201 and second n$^+$-type region 202 based on the above-described distribution diagrams. For the sake of comparison, FIG. 19A shows a schematic diagram for a case where α1 and α2 are wide and have an equal width of approximately 51 μm (this shall be referred to hereinafter as "a-structure"). FIG. 19B illustrates the case where first n$^+$-type region 201 is provided with an adequately narrow width in comparison to second n$^+$-type region 202 as shown in FIG. 15 (α1<<α2; this shall be referred to hereinafter as "b-structure").

With the distribution diagrams on which FIG. 19A is based, the densities are distributed symmetrically since α1 and α2 are equal. For a-structure, the illustration of the distribution diagrams shall be omitted and only the schematic diagram is shown.

When the widths α1 and α2 are wide (51 μm) as in the case of FIG. 19A, a current path (from the p1 region to the vicinity of the q1 region) is formed between the opposing surfaces and near the bottom surface part as indicated by the arrows. With the present Specification, the path for the electron current and hole current, which is formed in the region which is the upper part than a predetermined depth from the substrate surface and is formed between the opposing surfaces OS of first n$^+$-type region 201 and second n$^+$-type region 202 and at insulating region 203 between the vicinities of the bottom surfaces of the two regions as illustrated, shall be referred to as a first current path I1. That is, first current path I1 is the only current path of a protecting element of a-structure.

Meanwhile, when, as shown in FIG. 19B, α1 is narrowed to approximately 5 μm, in addition to first current path I1, which is formed between opposing surfaces OS and in the vicinities of the bottom surface parts, a path for the electron current and the hole current is formed at regions deeper than those of first current path I1. This path wraps around first n$^+$-type region 201, and with this path, the side wall at the outer side of the first n$^+$-type region at the side opposite opposing surface OS is used for flow of the electron current and hole current and the q1 region is formed at a lower location in comparison to a-structure.

The path for the electron current and the hole current, which is formed at regions deeper than those of first current path I1 and is formed at an insulating region from second n$^+$-type region 202 to the side surface at the side opposite opposing surface OS of first n$^+$-type region 201 as illustrated, shall be referred to as a second current path I2.

With second current path I2 in FIG. 19B, since the width of second n$^+$-type region 202 is 51 μm and thus adequately wide, the current path is formed in the horizontal direction at wider bottom surface part near second n$^+$-type region 202 than the case of the current path near the bottom of second n$^+$-type region at a-structure.

Meanwhile with first n$^+$-type region 201, since the width α1 is narrow and approximately 5 μm as mentioned above, current flows so as to wrap around first n$^+$-type region 201 and not only the bottom surface part of first n$^+$-type region 201 but the side surface at the side opposite opposing surface OS also becomes a part of the current path.

Thus as is clear from the above-described drawings, whereas in the case of a-structure, only first current path I1 is the current path of the protecting element, with protecting element 200 of b-structure, a second current path I2 is formed due to the narrow first n$^+$-type region 201 and thus the two current paths of first current path I1 and second current path I2 are formed.

With second current path I2, current flows in and out from the side surface at the outer side of first n$^+$-type region 201. Also, the second current path I2 passes through regions deeper than the regions which first current path I1 passes through and by reaching first n$^+$-type region 201 in a detouring (roundabout) manner, provides a long path inside insulating region 203. Traps (EL2, in the case of GaAs) inside insulating region 203 can thus be used to increase the opportunity for a conductivity modulation effect.

That is, with b-structure, by the provision of second current path I2, the conductivity modulation efficiency is improved in comparison to a case where only first current path I1 is provided and the flowing of a larger amount of current is enabled. The current value that flows between the first and second n$^+$-type regions is increased, whereby a larger amount of electrostatic current can be made to flow when static electricity is applied and the effect as a protecting element is increased.

The method of improving the conductivity modulation efficiency by intentionally detouring of the current path over a long distance to increase the chances that main carriers will encounter the carriers of the opposite polarity is frequently employed in IGBTs and other conductivity modulation devices and shall be described in detail below.

Generally, what makes an insulating region an insulating region is the existence of traps. As an inherent property, a donor trap has a positive charge, becomes neutral upon capturing an electron, and can become a medium for conductivity modulation. In the case of GaAs, EL2 is the donor trap. Traps also exist in an insulated region formed by impurity implantation.

Figure 20:
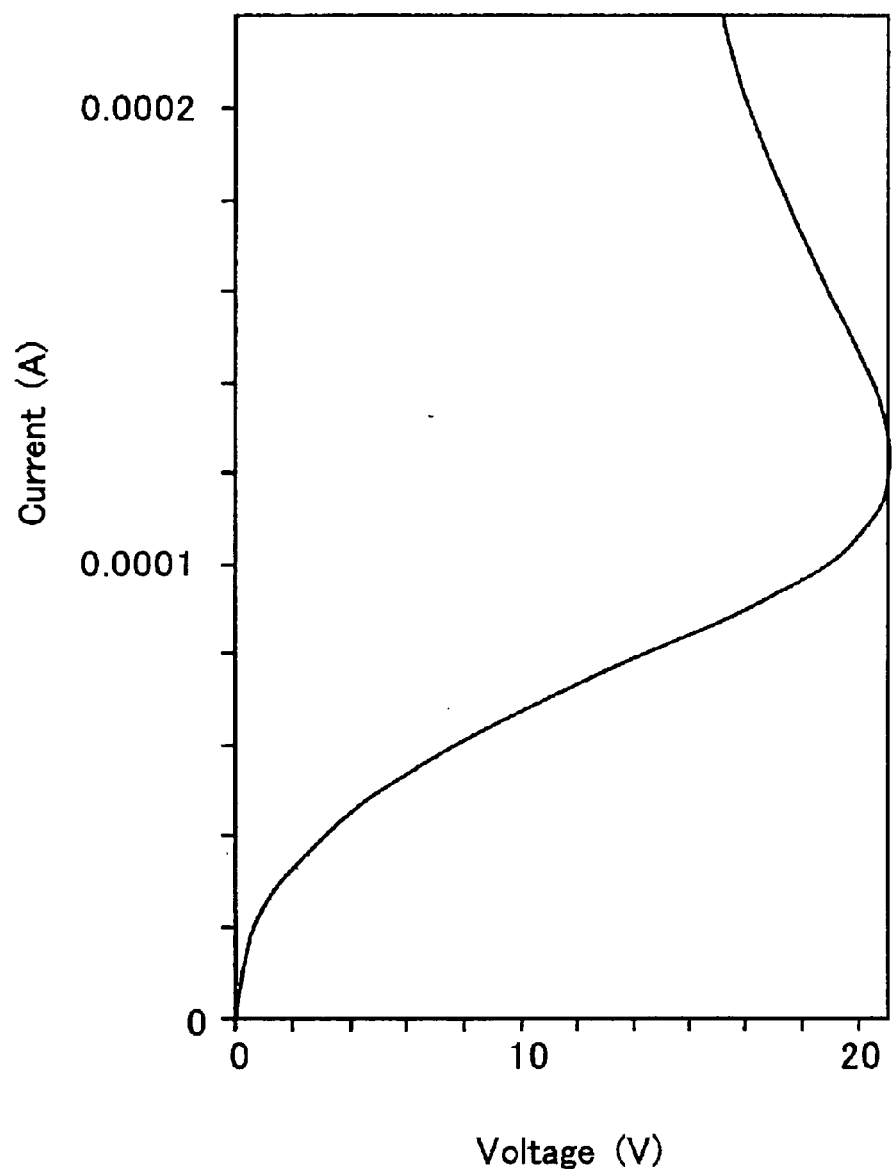
FIG. 20 is a current-voltage diagram of the device simulation.

FIG. 20 shows the results of simulating the voltage-current characteristics at a perspective depth of 1 μm when with a device of the structure shown in FIG. 15, first n$^+$-type region 201 is made the positive side and the voltage applied across first n$^+$-type region 201 and second n$^+$-type region 202 is increased. As illustrated in this Figure, the breakdown voltage is 20 to 30V.

Protecting element 200 thus breaks down at 20 to 30V and when a greater voltage is applied, it undergoes bipolar operation and conductivity modulation occurs. Since a protecting element is used by making it break down when an electrostatic voltage of several hundred V is applied, conductivity modulation occurs from the initial stage of the operating state of protecting element 200.

As this conductivity modulation occurs more frequently, since the avalanche multiplication following breakdown becomes intense and electron-hole generation and recombination occur more actively, more current flows.

Thus by the forming of second current path I2 in protecting element 200, the conductivity modulation efficiency at deep regions and in the outward direction of first n$^+$-type region 201 at the side opposite opposing surface OS can be improved.

Also since the width of first n$^+$-type region 201 is narrowed to 5 μm or less in order to provide second current path I2, in first current path I1, the electrons in the vicinity of first n$^+$-type region become crowded and repel each other to cause electrons, which are the major carriers, to pass through paths that are deeper and wider in comparison to a-structure, and thus current path I1 itself is more subject to conductivity modulation correspondingly.

Figure 21:
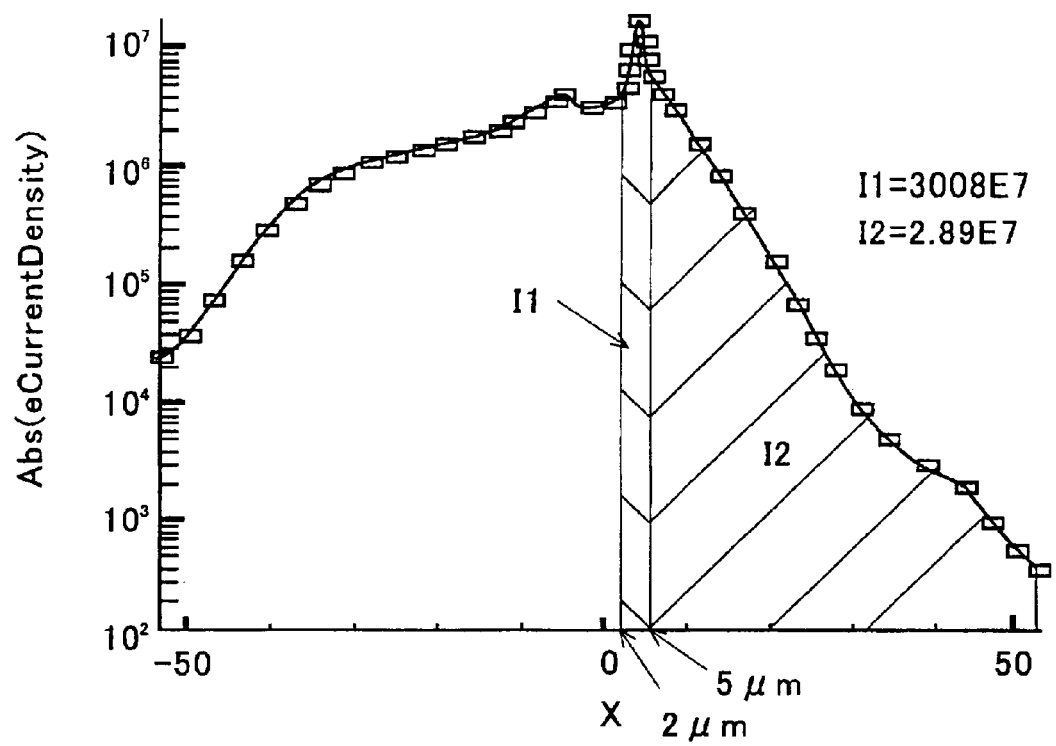
FIG. 21 shows simulated current density as a function of X coordinate.

The graph of FIG. 21 is used to determine the proportion of the current value of second current path I2 with respect to the total current value of b-structure. This is a graph of the X-coordinate dependency of the electron current density at a depth of 2 μm from the surface that results from a simulation wherein first n$^+$-type region 201 is made the positive side and a current of 1A is made to flow at a perspective depth of 1 μm, assuming the application of an electrostatic voltage of approximately 700V at 220 pF and 0 Ω.

For the electron current density at a depth of 2 μm from the surface, the electron current density immediately below first n$^+$-type region 201 is integrated along the width in the X-direction of first n$^+$-type region 201 to determine the value corresponding to first current path I1, the electron current density at the outer part with respect to first N$^+$-type region 201 is integrated along the width in the X-direction of the outer part to determine the value corresponding to second current path I2, and the proportion of the current value of second current path I2 is calculated.

As a result, the current value of second current path I2 was found to be of a proportion of 0.48 (2.89/(3.08+2.89)) with respect to the total current value and thus of a current value of the same level of that of first current path I1.

Furthermore, as shall be described later, in the case of b-structure, first current path I1 itself exhibits a larger current value than first current path I1 in the case of a-structure. Thus with b-structure, since second current path I2 itself is of the same level as first current path I1, in total, a far greater amount of current flows in comparison to a-structure.

Since as a secondary effect, first current path I1 and second current path I2 combine as described above to significantly enlarge the current path in comparison to a-structure, the temperature inside the crystal becomes lower than that of the a-structure, the mobilities of electrons and holes increase correspondingly, and thus a correspondingly larger amount of current can be made to flow.

Since the current value of protecting element 200 as a whole thus increases, the protection effect increases.

FIG. 22 show a table in which the spreading of the electron current, hole current, and recombination density are compared. Here, simulations were carried out for a-structure and b-structure and the resulting values of the same type of density distributions as those shown in FIG. 16 through FIG. 18 are compared under fixed conditions.

Figures 22A, 22B, 22C:
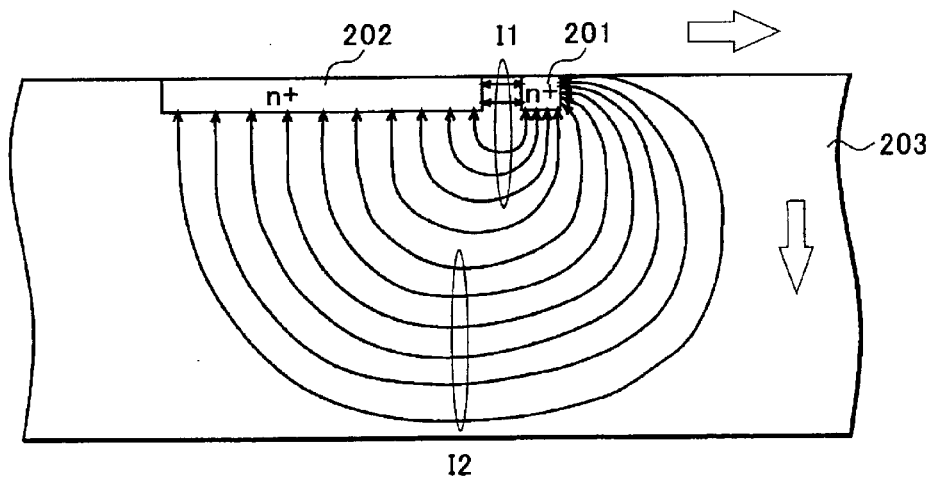
FIGS. 22A and 22B show results of the simulation.
FIG. 22C is a schematic diagram of the current paths of the b-structure.

In FIG. 22A, "y_2" is the numerical value in units of μm of the width in the X-direction of a section, obtained in the corresponding density distribution diagram by cutting in the horizontal direction at a depth of 2 μm from the surface, at which the corresponding density becomes $10^5$ cm$^{-3}$.

"X_0" is the numerical value in units of μm of the depth from the surface at which the corresponding density becomes $10^5$ cm$^{-3}$ in the Y-direction section at X=0 μm in the coordinate system shown in FIG. 15.

"Product" is the value obtained by multiplying the value of y_2 by the value of x_0 and is a value for comparing, in a simulating manner, the area of the figure formed when the points at which the corresponding density becomes $10^5$ cm$^{-3}$ are traced and joined together. That is, "product" is an index that expresses the respective spreading of electrons, holes, and recombination.

Also in the table, "a-structure" is an a-structure with which both first n$^+$-type region 201 and second n$^+$-type region 202 have a width of 51 μm (=α1=α2), second n$^+$-type region 202 is made the positive side, the first n$^+$-type region is made the negative side, and the perspective depth is made 1 μm, and the values for this structure are the calculation results for a case where 0.174A is made to flow.

The "b-structure-1" is a b-structure with which the width α1 of first n$^+$-type region 201 is set to 3 μm, the width α2 of second n$^+$-type region 202 is set to 51 μm, second n$^+$-type region 20 is made the positive side, and the first n$^+$-type region is made the negative side, and the values for this structure are the calculation results for a case where 0.174A is made to flow at a perspective depth of 1 μm.

The "b-structure-2" is a b-structure with which the applied polarity is reversed with respect to that of b-structure-1, that is, with which the width α1 of first n$^+$-type region 201 is set to 3 μm, the width α2 of second n$^+$-type region 202 is set to 51 μm, the first n$^+$-type region is made the positive side, and the second n$^+$-type region is made the negative side, and the values for this structure are the calculation results for a case where 0.174A is made to flow at a perspective depth of 1 μm.

For all three of the abovementioned densities, the product values of both b-structure-1 and b-structure-2 are greater than those of a-structure.

This indicates that regardless of polarity, that is, regardless of whether the first n$^+$-type region 201 side is positive or the second n$^+$-type region 202 side is positive, the electron current, hole current, and recombination are all distributed over a wider range with b-structure than with a-structure and thus that the conductivity modulation efficiency is higher with b-structure than with a-structure. Furthermore, that the current flows across a wider range indicates that the temperature drops, thus indicating that the mobility increases correspondingly and the current increases further.

The calculation results for the case where 1A is made to flow through a b-structure-3, which is a b-structure with which first n⁺-type region 201 is made the positive side, are shown in FIG. 22B. Whereas a comparison was made for a unified current of 0.174A from the standpoint of calculation ability in the three calculations of FIG. 22A, with actual static electricity the current at a perspective depth of 1 μm is approximately 1A for conditions of a 700V electrostatic voltage, 220 pF, and 0 Ω. The results are shown here since calculation by simulation for 1A was possible only for the case where first n⁺-type region 201 is made the positive side.

In comparison to b-structure-2 of FIG. 22A, with b-structure-3, even though the polarity is the same, the values of the respective products are increased by one order of magnitude or more when the current is increased from 0.174A to 1A.

Thus as shown in FIG. 22C, if in a case where a higher electrostatic voltage is applied to protecting element 200 and more electrostatic current flows than the current shown in FIG. 16 and FIG. 19B, which is a schematic diagram of FIG. 16, insulating region 203 is adequately large, the region surrounded by the q1 region (region of a current density of approximately 10% or more of the region of highest density) shown in FIG. 16 spreads further downwards and in the outer direction at the side opposite opposing surface OS, that is, second current path I2 spreads. Since the more second current path I2 spreads, the further the conductivity modulation efficiency can be increased, the more current flows, and the further the region surrounded by q1 region spreads downwards, second current path I2 spreads even further. Since the crystal temperature of the substrate is thus lowered, the carrier mobilities can be increased further, more current can be made to flow, and the protection effect can be improved further.

Thus with b-structure, the higher the electrostatic voltage that is applied, the higher the conductivity modulation efficiency becomes and the more the current path spreads, that is, the conductivity modulation effect can be adjusted automatically.

Also, with first current path I1, the higher the electrostatic voltage, the deeper the current flows, and thus as with second current path I2, the conductivity modulation effect can be adjusted automatically.

Thus, although details shall be given later, by securing an adequate area of insulating region 203 that can become second current path I2, a structure is provided with which a protected element can be protected from damage even from static electricity of 2500V at 220 pF and 0 Ω. Moreover, since there is hardly any parasitic capacitance, the high-frequency characteristics of protected element will not be degraded. That is, by connecting the present protecting element with a parasitic capacitance of 20 fF to an element which by itself has an electrostatic breakdown voltage of only approximately 100V, the electrostatic breakdown voltage can be improved by 20 times or more.

The reason why a value of 5 μm or less is preferable for α1 of b-structure shall now be described using FIG. 23. With FIG. 23, the electron current densities in b-structure-2 in FIG. 22 are calculated while varying the width α1 of first n⁺-type region 201.

When the width α1 of first n⁺-type region 201 is made 5 μm or less, the proportion of second current path I2 increases suddenly. That is, since the current spreads in the horizontal direction and the depth direction, the conductivity modulation efficiency increases correspondingly and the temperature drops, thereby increasing the carrier mobility, and thus the current value increases significantly and the protection effect of the protecting element increases greatly.

Figure 23:
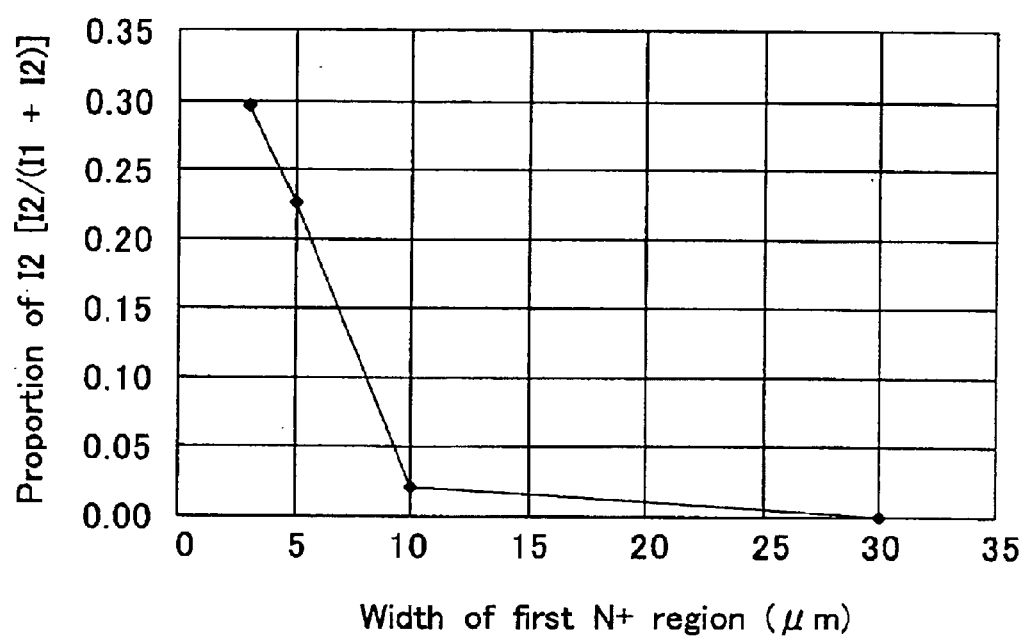
FIG. 23 shows ratios of simulated currents.

Here, whereas the proportion of second current pass I2 was 0.48 for the case of α1=3 μm shown in FIG. 21, the I2 proportion for the point corresponding to a first n⁺-type region width of 3 μm for the same positive first n⁺-type region is only 0.3 in the abovementioned FIG. 23 because FIG. 23 shows values for 0.174 while FIG. 21 shows values for 1A, and it can be understood that up until a certain fixed current value, the greater the current, the greater the proportion of second current path I2. Furthermore, although a comparison was made with 0.174A due to the limits of the calculation capacity for simulating a large device, as long as a relative comparison is being made, an adequate comparison can be made with this current value.

The width β of insulating region 203 that should be secured at the outer side of first n⁺-type region 201 shall now be described. As mentioned above, with second current path I2, since second current path I2 spreads to insulating region 203 at the side opposite opposing surface OS of first n⁺-type region 201, insulating region 203 of an adequate width β is preferably secured at this side.

Figure 24A:
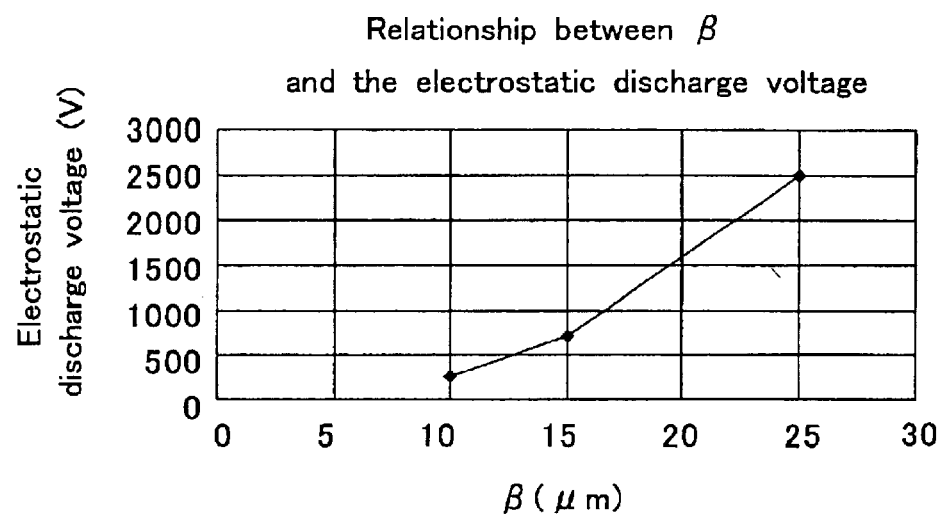
FIG. 24A shows the simulated discharge voltage as a function of a geometric factor.
Figure 24B:
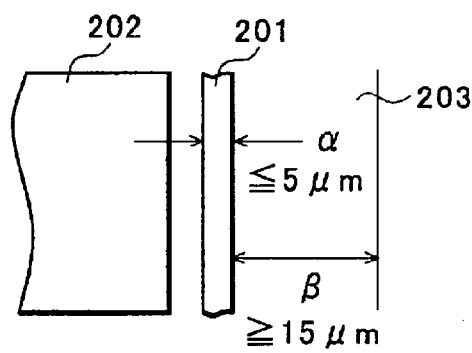
FIG. 24B shows the geometrical factor as part of the modeling.

The relationship between the β of a b-structure and the electrostatic breakdown voltage shall now be described with reference to FIG. 24. As mentioned above, securing an adequate area of insulating region 203 is equivalent to securing an adequate region that can become second current path I2 and thus provides a high protection effect. That is, a predetermined insulating region width β is secured at the side opposite opposing surface OS as shown in the plan view of FIG. 24B. FIG. 24A shows the results of the experiment to measure the electrostatic breakdown voltage upon varying the value of β.

The protected element used for measurements is an element in which a resistance of 10KΩ is connected in series to the gate of a GaAs MESFET with a gate length of 0.5 μm and a gate width of 600 μm. Prior to connection of protecting element 200, the electrostatic breakdown voltage across the source or drain electrode and the resistance end (gate electrode) is approximately 100V. The electrostatic breakdown voltages are then measured upon connecting the respective ends of first n⁺-type region 201 and second n⁺-type region 202 of protecting element 200 of b-structure in parallel between the source or drain electrode and the resistance end (gate electrode) and varying the value of β. The distance of opposing surface OS is 60 μm. The capacitance across first n⁺-type region 201 and second n⁺-type region 202 is 20 fF.

As shown in FIG. 24A, when β is increased to 25 μm, the electrostatic breakdown voltage is improved to 2500V. The electrostatic breakdown voltage when the β shown in FIG. 24B is 15 μm is 700V. This means that when the electrostatic voltage is increased from 700V to 2500V, second current path I2 extends by 15 μm or more in the outer direction (β) at the side opposite opposing surface OS of first n⁺-type region 201.

That the electrostatic voltage increases means that second current path I2 spreads correspondingly. In other words, although the spreading of second current path I2 will be restricted if an adequate are of insulating region 203 is not secured, by securing an adequate area of insulating region 203, second current path I2 can be spread adequately.

Thus with b-structure, by securing a width β of 10 μm or more and preferably 15 μm or more for insulating region 203 at the outer side of first n⁺-type region 201, second current path I2 can be spread further to increase the conductivity modulation efficiency further.

Although with a-structure, the electrostatic breakdown voltage could only be increased by two to three times when a protecting element is connected, for b-structure, it has been confirmed that an electrostatic voltage of 700V is realized if β is 15 μm, and by extending β to 25 μm, the electrostatic voltage can be increased by 2500V, in other words, by 25 times. Thus with b-structure, by securing a predetermined β, a current of at least approximately 10 times that which can be made to flow through a a-structure protecting element can be made to flow through.

As mentioned above, the current that flows through first current path I1 and the current that flows through second current path I2 are nearly equivalent and thus that a current of at least 10 times that which can be made to flow through a prior-art protecting element can be made to flow through can be understood as meaning that for both first current path I1 and second current path I2, the current that flows through each current path is respectively at least 5 times that which can be made to flow through a prior-art protection circuit.

It is thus preferable for β to be 10 μm or more, and this means that in integrating a protecting element 200 in a chip, other components, wiring, etc., should be positioned upon securing an insulating region 203 with a width β at the outer side of first n⁺-type region 201.

Figure 25A:
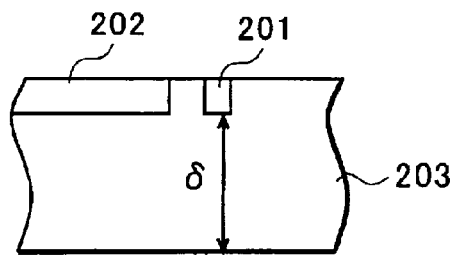
FIG. 25A shows a geometrical factor as part of the modeling.

Likewise as shown in FIG. 25, in order to secure second current path I2, it is preferable to secure an adequate are of insulating region in the depth direction as well. FIG. 25A is a sectional view, and here, an insulating region 203 of a predetermined depth δ is secured below first n⁺-type region 201 and second n⁺-type region 202.

Figure 25B:
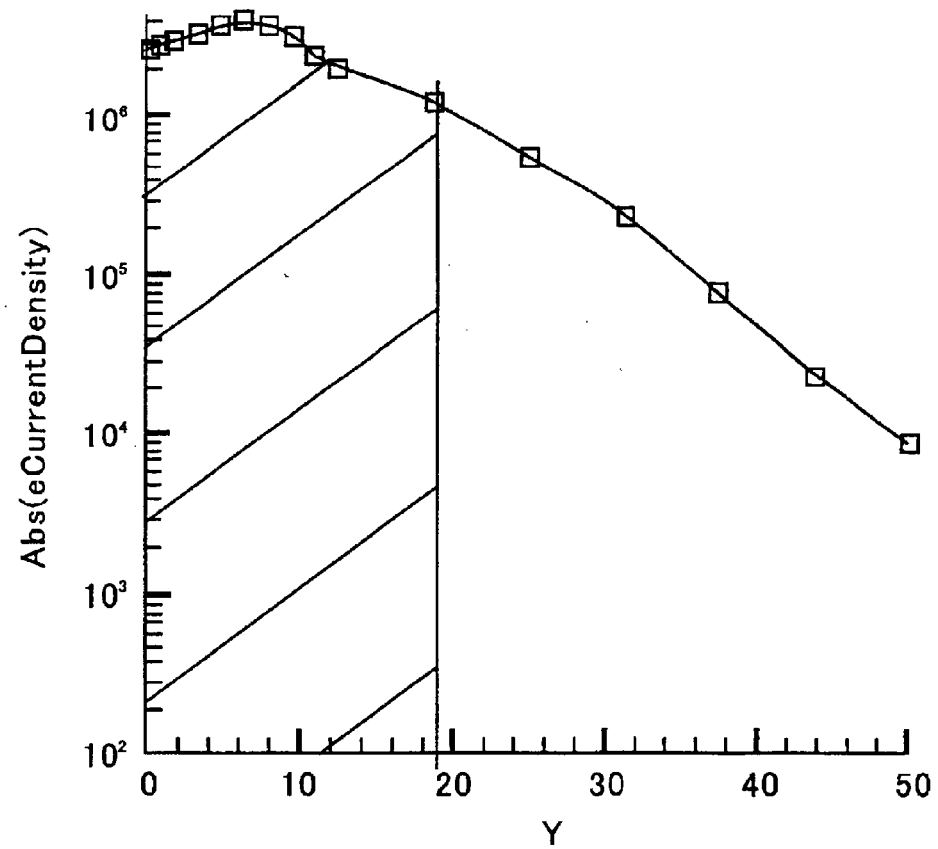
FIG. 25B shows the simulated current density.

FIG. 25B shows a graph of the electron current density along the Y-direction section at coordinate X=0 μm when a simulation is performed in which first n⁺-type region 201 is made the positive side and 1A is made to flow at a perspective depth of 1 μm in assumption of the application of an electrostatic voltage of 700V at 220 pF and 0 Ω. When the electron current density is integrated along the depth direction from the surface of this graph, the integral (hatched part) up to a depth (Y) of 19 μm was found to be 90% of the integral up to the total depth of 50 μm. The depth δ of insulating region 203 is thus preferably 20 μm or more.

Although the sizes (β and δ) of insulating region 203 that should be secured at the periphery of protecting element 200 and width (α1) of first n⁺-type region 201 were described above, depending on the position on a chip, it may not be possible to secure an adequate β or δ or an adequate distance of opposing surfaces OS.

Figure 26A:
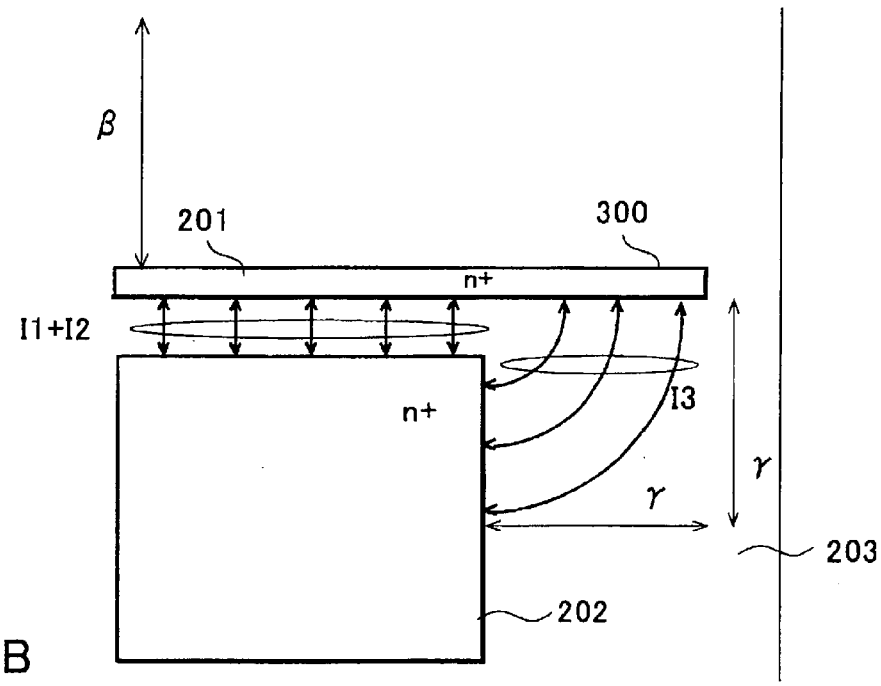
FIG. 26A shows a geometrical factor as part of the modeling.

Thus in such a case, as shown in the plan view of FIG. 26A, an extension part 300 is provided first n⁺-type region 201. The third current path I3, which is to be an electron current and hole current path of high conductivity modulation efficiency, may be formed between second n⁺-type region and the extension part 300, which secures a predetermined insulating region γ in the insulating region 203

With the third current path I3, a larger current path can be secured in the insulating region 203 between extension part 300 and second n⁺-type region 202. Although only a planar representation is provided in the figure, since the third current path I3 is also formed in direction perpendicular to the paper surface (direction of the depth of the device), the current in the depth direction increases as well. In the depth direction (direction perpendicular to the paper surface) of opposing surfaces OS, the first current path I1 and the second current path I2 are formed, and the first, second, and third current paths I1 to I3 become the current paths of the protecting elements.

Figure 26B:
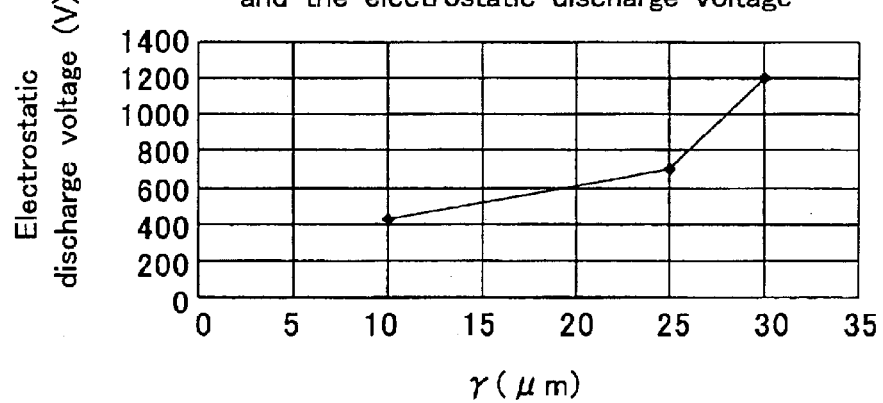
FIG. 26B shows the simulated discharge voltage as a function of the geometrical factor.

In FIG. 26B, actually measured values are shown for comparison of γ and the electrostatic breakdown voltage. Protected element and protecting element 200 are connected by the same method as that employed for FIG. 24, with which the electrostatic voltage was measured while varying the value of β.

As shown in FIG. 26B, when γ is increased to 30 μm, the electrostatic breakdown voltage is improved to 1200V. When γ is 25 μm, the electrostatic breakdown voltage is 700V. This means that when the electrostatic breakdown voltage is increased from 700V to 1200V, third current path I3 extends by 25 μm or more in the insulating region 203 between extension part 300 and the second n⁺-type region.

Thus even in the case where extension part 300 is provided, current path I3 can be spread further and the conductivity modulation efficiency can be increased further the higher the electrostatic voltage. In other words, the conductivity modulation effect can be adjusted automatically according to the voltage of the applied static electricity. Since the temperature of the insulating region is thereby lowered and the carrier mobilities can be increased further, more current is made to flow, and the protection effect is improved.

In other words, an adequate area of insulating region 203 is preferably secured at the periphery of extension part 300 as well and by securing an adequate γ, a space in which third current path I3 can spread adequately can be secured to make more electrostatic current flow in correspondence to the electrostatic voltage. Thus the width γ is preferably 10 μm or more and more preferably 20 μm or more. The effect can be improved by securing γ at the sides of both side surfaces of extension part 300.

It is optimal to secure γ upon securing β, even if β is inadequate, the effect of the protecting element is improved by securing γ.

Figure 27:
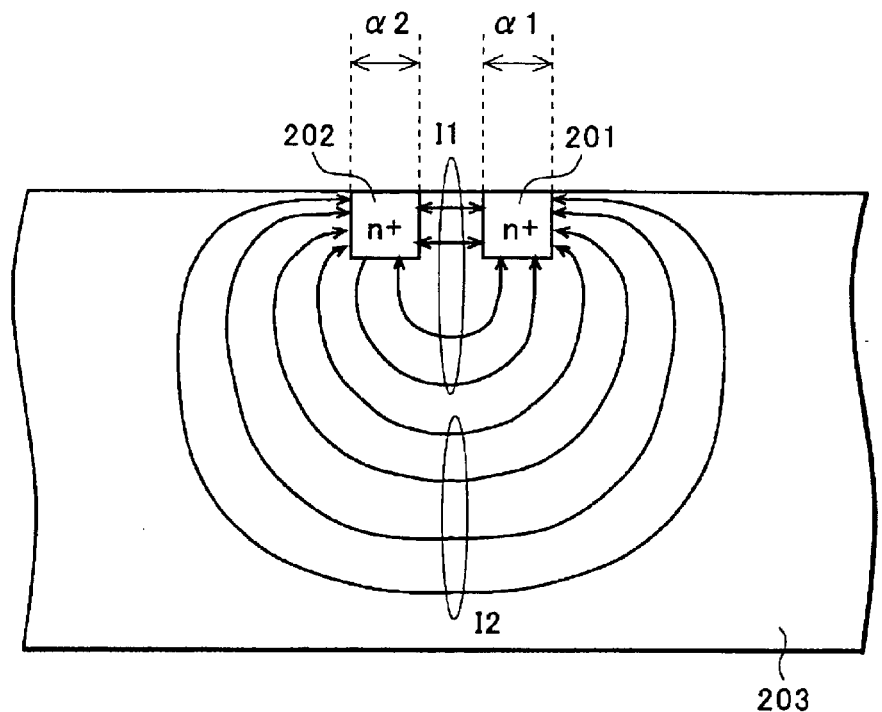
FIG. 27 is a schematic diagram of the current paths of a c-structure.

FIG. 27 shows a schematic diagram of current paths in a case where both first n⁺-type region 201 and second n⁺-type region 202 have a width of 5 μm or less (this structure shall be referred to as "c-structure").

C-structure is a structure in which the width α2 of second n⁺-type region 202 of b-structure is narrowed so as to be equal to α1 of the first n⁺-type region, and these regions are disposed in opposing manner at a mutual distance of approximately 4 μm and have insulating region 203 disposed at the periphery. First current path I1 and second current path I2 are formed with c-structure as well.

First current path I1 is formed from the substrate surface to the parts between opposing surfaces OS of the first and second n⁺-type regions and in insulating region 203 between the vicinities of the bottom surfaces of the two n⁺-type regions and is a path for the electron current and the hole current.

Second current path I2 is formed so as to detour through regions that are adequately deeper than the first current path I1 and reach the side surfaces of the two regions at the sides opposite opposing surfaces OS. That is, for both first n⁺-type region 201 and second n⁺-type region 202, the side surfaces at the sides opposite opposing surfaces OS can be used for the current path and second current path I2 is formed in regions deeper than first current path I1.

Figure 28:
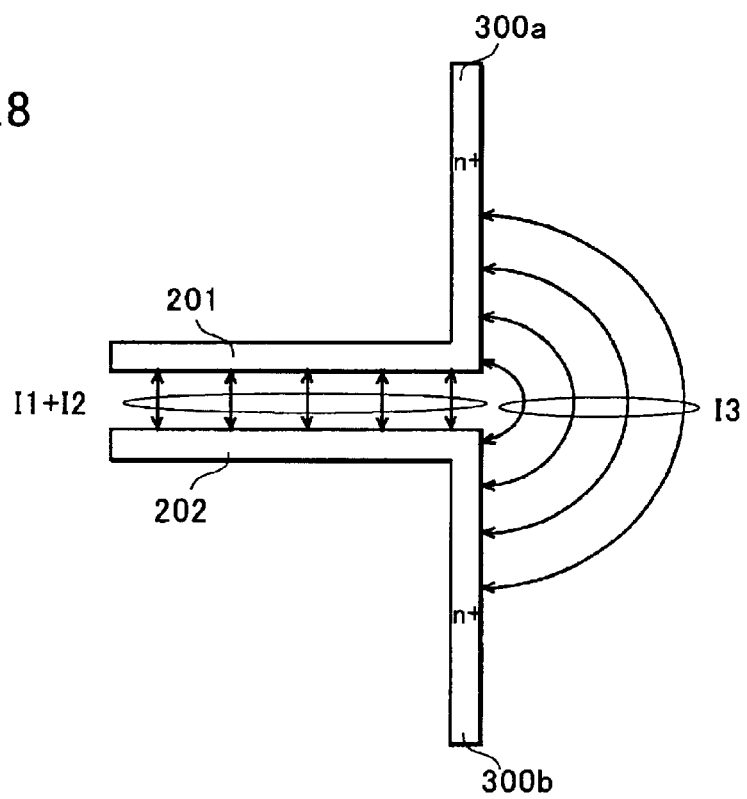
FIG. 28 is a schematic plan view for a different modeling.
Figure 29A:
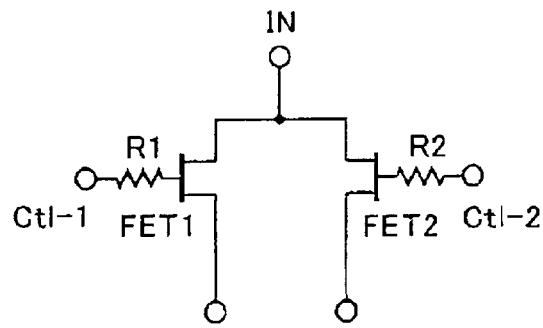
FIG. 29A is a circuit diagram and FIG. 29B is a plan view of a conventional switching device.
Figure 29B:
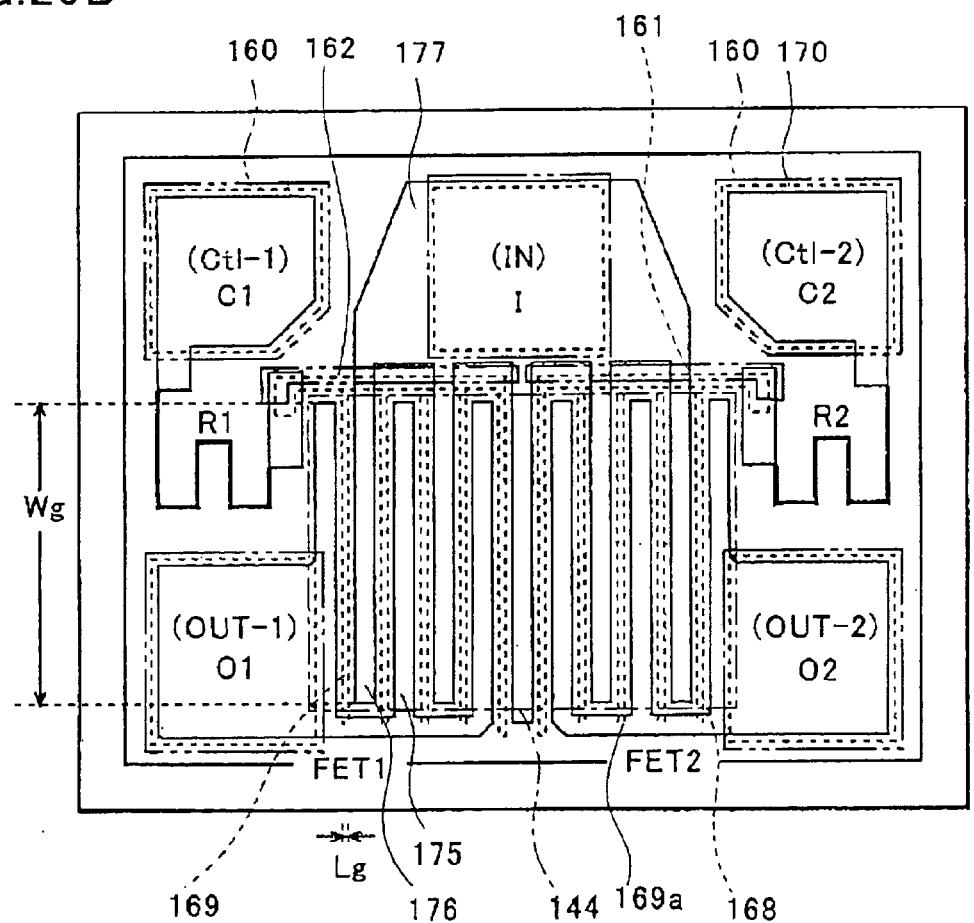
Figure 30A:
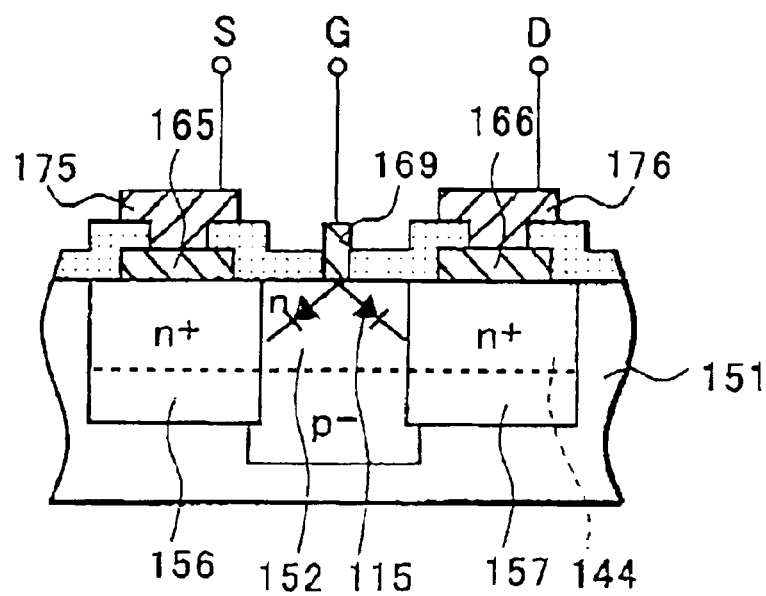
FIG. 30A is a sectional view and FIG. 30B is a schematic circuit diagram of the device of FIG. 29B.
Figure 30B:
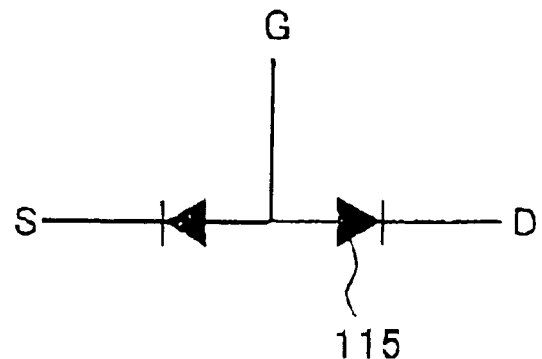
Figure 31A:
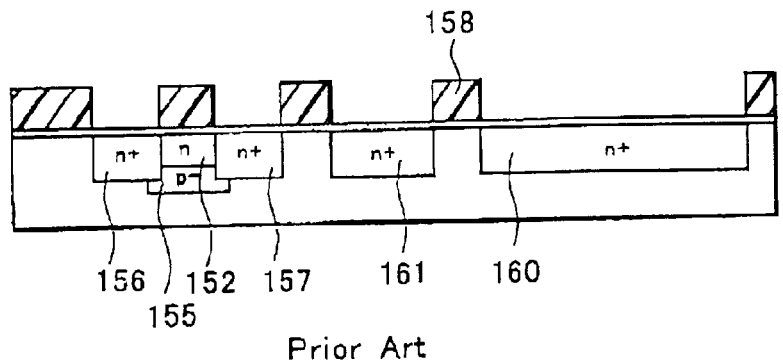
FIGS. 31A–31D and 32A–32C show processing steps of a manufacturing method of the device of FIG. 29A.
Figure 31B:
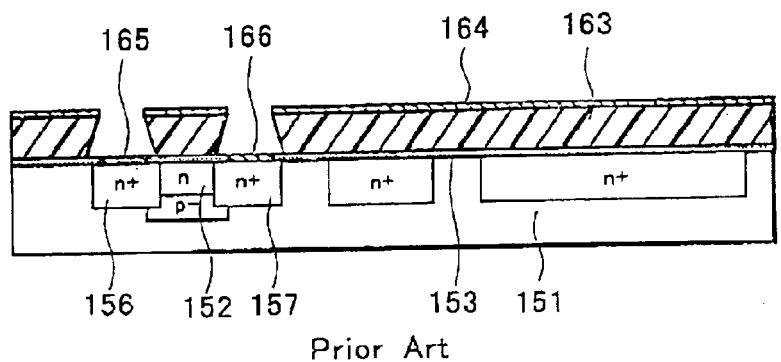
Figure 31C:
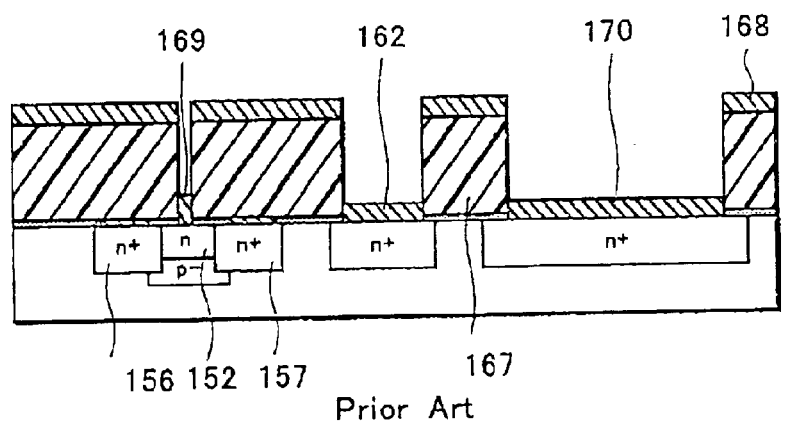
Figure 31D:
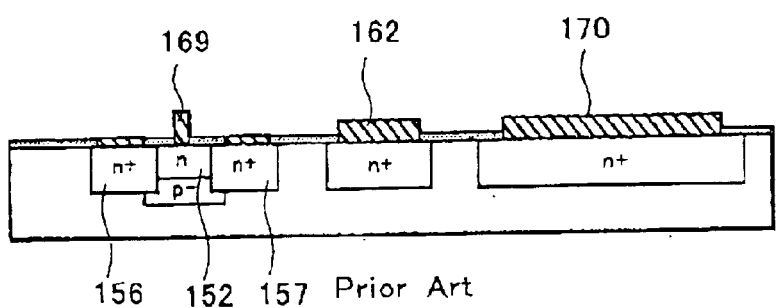

Furthermore as shown in FIG. 28, first n⁺-type region 201 may be provided with an extension part 300a to form a third current path I3 that is to be a path for the electron current and the hole current that causes conductivity modulation in the insulating region of extension part 300a and second n$^+$-type region 202.

Likewise, second n$^+$-type region 202 may be provided with an extension part 300b to form a third current path I3 that is to be a path for the electron current and the hole current that causes conductivity modulation in the insulating region of extension part 300b and first n$^+$-type region 201.

Just one of either of extension parts 300a and 300b may be provided or both of the n$^+$-type regions may be provided with extension parts. And as shown in drawing, these may be bent in the direction away from opposing surface OS. Since current path I3 is thereby formed as shown in FIG. 28, the current value increases and the protection effect increases.

As values of $\beta$, $\gamma$, and $\delta$, the abovementioned values are favorable, and although values less than or equal to the abovementioned values will still enable the securing of current paths that are greater in comparison to those of a-structure, it is preferable to provide a pattern that can secure the respective values described above as much as possible.

That is, an adequate space ($\beta$, $\gamma$) is preferably secured in insulating region 203 at the periphery of first n$^+$-type region 201 (in the case of c-structure, of second n$^+$-type region 202 as well) that makes up protecting element 200 so as not to obstruct second current path I2 or third current path I3, and protected element to which protecting element 200 is connected and other components and wiring, etc., are preferably disposed at the outer side of first n$^+$-type region 201 at a distance of approximately 10 $\mu$m or more. Also, since chip end parts can also obstruct a current path, in the case of a pattern in which first n$^+$-type region 201 is positioned at a chip end part, approximately 10 $\mu$m or more is preferably secured as the distance to the chip end part as well.

Hereinafter, the patterns of the protecting element 200 will be described with reference to FIG. 4 and FIG. 13. In the switching circuit device of FIG. 4, the protecting element 200 is connected to the output terminal pad O1 and output terminal pad O2, for example. As described above, in the vicinity of the respective pads 70, high concentration impurity regions 100b are arranged, the gate metal layer 68 positioned undermost the respective electrode pads 70 forms a Schottky junction with the GaAs semi-insulating substrate, and the high concentration impurity regions 100b and the respective electrode pads 70 form Schottky junctions.

Namely, in FIG. 4, by arranging the resistors R3 and R4 in a manner approximated to the output terminal pads O1 and O2, the alienation distance between the n$^+$-type regions of the resistor R3 and R4 and high concentration impurity regions 100b at the periphery of the electrode pad results in 4 $\mu$m, and an insulating region 203 is arranged in the surroundings, thus a protecting element 200 is completed. A part of the resistors R3 and R4 is a first n$^+$-type region 201, and a part of the high concentration impurity regions 100b at the periphery of the output terminal pad O1 and O2 is a second n$^+$-type region 202. Herein, the high concentration impurity region 100b is, in terms of a protecting element 200, connected to an output terminal pad O1, namely, this has a b-structure with a wide $\alpha$2 width. Namely, this means that a protecting element 200 is connected in parallel between the control terminal and output terminal of a switching circuit device. In this pattern, the width of the resistors R3 and R4 is $\alpha$1, and this is provided as 5 $\mu$m or less.

Furthermore, the width $\beta$ of the insulating region 203 on the outer side of the resistors R3 and R4 to be a first n$^+$-type region 201 is secured with 10 $\mu$m or more, and other components are arranged. In this pattern, the end of $\beta$ is a chip end, and the distance $\beta$ from the resistors R3 and R4 to the chip end is secured with 10 $\mu$m or more.

However, in FIG. 4, $\beta$ cannot be secured with 10 $\mu$m or more in some cases, and accordingly, a current to flow through the current path I2 is reduced. As a countermeasure, an extension part 300 is formed by being extended from first n$^+$-type region 201 of the protective element 200 is provided and a region to form a third current path I3 is secured in the insulating region 203 between the extension part 300 and second n$^+$-type region 202.

In the pattern of FIG. 4, by securing, in the insulating region 203 between the resistor R3 and high concentration impurity region 100b, a 10 $\mu$m or more width as $\gamma$ in directions orthogonal to the respective regions, an insulating region 203 between the resistors R3 and R4 and high concentration impurity region 100b results in a current path I3. Namely, even though the second current path I2 is not sufficiently secured, a Schottky junction between the control terminal and output terminal of a switching circuit device is sufficiently protected from static electricity by forming the third electric path I3.

On the other hand, similar to FIG. 4, a protecting element 200 is connected to the output terminal pad O1 and output terminal pad O2 in the switching circuit device of FIG. 13, as well. In the switching circuit device of FIG. 13, at the periphery of the respective electrode pads 70, a peripheral n$^+$-type region 160 to form a Schottky junction with the pad is arranged.

Namely, in FIG. 13, by arranging the resistors R3 and R4 in a manner approximated to the output terminal pads O1 and O2, respectively, the alienation distance between the n$^+$-type regions of the resistor R3 and R4 and peripheral n$^+$-type region 160 results in 4 $\mu$m, and an insulating region 203 is arranged in the surroundings, thus a protecting element 200 is completed. A part of the resistors R3 and R4 is a first n$^+$-type region 201, and a part of the n$^+$-type regions 160 at the periphery of the output terminal pad O1 and O2 is a second n$^+$-type region 202. Namely, this means that a protecting element 200 is connected in parallel between the control terminal and output terminal of a switching circuit device.

In this pattern, the width of the resistors R3 and R4 is $\alpha$1, and this is provided as 5 $\mu$m or less. Moreover, in the pattern of FIG. 13, the second n$^+$-type region 202 is not the whole surface under the electrode pad but is only in the peripheral part. However, as described above, in a case of this pattern, since a side surface opposite the opposing surface OS is not utilized as a second current path I2, a b-structure is provided in this case.

In this pattern as well, the width $\beta$ of the insulating region 203 on the outer side of the resistors R3 and R4 to be a first n$^+$-type region 201 is secured with 10 $\mu$m or more, and other components are arranged. In this pattern, the end of $\beta$ is a chip end, and the distance $\beta$ from the resistors R3 and R4 to the chip end is secured with 10 $\mu$m or more.

Moreover, if $\beta$ cannot be secured with 10 $\mu$m or more, it is satisfactory to provide an extension part 300 in the first n$^+$-type region 201 and form a third current path I3 in the insulating region 203 between the extension part 300 and second n$^+$-type region 202.

Thus, the protecting element 200 of this embodiment should be connected between two terminals of the protected element, upon making the width of at least one of the high concentration impurity regions of first n$^+$-type region 201 and the second n⁺-type region 5 μm or less, and upon securing an adequate area of insulating region (β, γ) at the periphery.

Although the insulating region 203 made of GaAs is used in the embodiments above, the insulating region 203 may be a region, which has been made insulating by the ion implantation and diffusion of an impurity into a substrate, and such an insulating region may also be used to provide a base for the device manufacturing.

What is claimed is:

1. A switching circuit device comprising:
a substrate comprising an insulating region;
a first field effect transistor, a second field effect transistor, a third field effect transistor and a fourth field transistor, each of the first, second, third and forth transistors comprising a source electrode, a gate electrode and a drain electrode;
a common input terminal connected to the source electrodes or the drain electrodes of the first and second transistors;
a first output terminal connected to the source electrode or the drain electrode of the first transistor, which is not connected to the common input terminal, and connected to the source electrode or the drain electrode of the third transistor;
a second output terminal connected to the source electrode or the drain electrode of the second transistor, which is not connected to the common input terminal, and connected to the source electrode or the drain electrode of the fourth transistor;
a first control terminal connected to the gate electrodes of the first and fourth transistors;
a second control terminal connected to the gate electrodes of the second and third transistors;
a high-frequency ground terminal connected to the source electrodes or the drain electrodes of the third and fourth transistors, which are not connected to the corresponding output terminals; and
a protecting element comprising a first high concentration impurity region, a second high concentration impurity region and at least part of the insulating region of the substrate, said part of the insulating region being located between the first and second high concentration impurity regions,
wherein the protecting element is connected between the first output terminal and the gate electrode of the third transistor or between the second output terminal and the gate electrode of the fourth transistor and is configured to discharge at least partially electrostatic energy of external origin through the protecting element so that the electrostatic energy is reduced enough not to provide an electrostatic breakdown voltage between the gate electrode and the corresponding source or drain electrode of the transistor that is connected to the protecting element.

2. The switching circuit device of claim 1, wherein the protecting element is configured to increase an electrostatic breakdown voltage between the gate electrode and the source electrode or the drain electrode of the transistor that is connected to the protecting element by approximately 20 volts from the electrostatic breakdown voltage of the corresponding transistor without the protecting element.

3. The switching circuit device of claim 1, wherein an electrostatic breakdown voltage of the switching circuit device is 200 volts or higher.

4. The switching circuit device of claim 1, wherein the protecting element is disposed along at least one side of a bonding pad of the corresponding output terminal.

5. The switching circuit device of claim 1, wherein the first high concentration impurity region is connected to a bonding pad of the corresponding control terminal or to a wiring line connected to the bonding pad.

6. The switching circuit device of claim 1, wherein the first high concentration impurity region is part of a resistor connecting a bonding pad of the corresponding control terminal and the gate electrode of the corresponding transistor.

7. The switching circuit device of claim 1, wherein the second high concentration impurity region is connected to a bonding pad of the corresponding output terminal or to a wiring line connected to the bonding pad.

8. The switching circuit device of claim 1, wherein the second high concentration impurity region is part of a third high concentration impurity region that is disposed adjacent a bonding pad of the corresponding output terminal or a wiring line connected to the bonding pad or is disposed below the bonding pad or the wiring line.

9. The switching circuit device of claim 1, wherein the insulating region is an impurity ion implanted region formed in the substrate.

10. The switching circuit device of claim 1, wherein the substrate is a semi-insulating substrate.

11. The switching circuit device of claim 1, wherein an impurity concentration of the insulating region is $1 \times 10^{14}$ cm$^{-3}$ or lower.

12. The switching circuit device of claim 1, wherein a separation between the first and second high concentration impurity regions of the protecting element is small enough for the discharged electrostatic energy to pass through.

13. The switching circuit device of claim 1, wherein impurity concentrations of the first and second high concentration impurity regions are $1 \times 10^{17}$ cm$^{-3}$ or higher.

14. The switching circuit device of claim 1, wherein a resistivity of the insulating region is $1 \times 10^3$ Ω·cm or higher.

15. The switching circuit device of claim 1, further comprising a metal electrode connected to a bonding pad corresponding to one of the terminals or to a wiring line connected to the bonding pad, wherein the first high concentration impurity region or the second high concentration impurity region is connected to the metal electrode.

16. The switching circuit device of claim 15, wherein the metal electrode forms a Schottky junction with the first or second high concentration impurity region that is connected to the metal electrode.

17. The switching circuit device of claim 15, wherein the metal electrode forms a Schottky junction with a surface of the insulating region at position that is away from an edge of the first or second high concentration impurity region that is connected to the metal electrode by up to 5 μm.

18. The switching circuit device of claim 1, wherein the transistors are metal-semiconductor field effect transistors, junction field effect transistors or high electron mobility transistors.

19. The switching circuit device of claim 1, wherein the first and second high concentration impurity regions are embedded in the insulating region of the substrate and a width of the first impurity region is smaller than a width of the second impurity region so that upon a start of discharging process of the electrostatic energy through the protecting element a first current path for electron or hole is formed in the insulating region between opposing faces of the first and second high concentration impurity regions and between bottom faces of the first and second high concentration impurity regions and that a second current path for electron or hole is formed in the insulating region between the bottom face of the second high concentration impurity region and another side face of the fist high concentration impurity region, the second current path being deeper than the first current path.

20. The switching circuit device of claim 19, wherein the first high concentration impurity region is connected to an extension part so that upon the start of discharging process of the electrostatic energy through the protecting element a third current path for electron or hole is formed in the insulating region between the extension part and the second high concentration impurity region.

21. The switching circuit device of claim 1, wherein the first and second high concentration impurity regions are embedded in the insulating region of the substrate and a width of the first impurity region is substantially equal to a width of the second impurity region so that upon a start of discharging process of the electrostatic energy through the protecting element a first current path for electron or hole is formed in the insulating region between opposing faces of the first and second high concentration impurity regions and between bottom faces of the first and second high concentration impurity regions and that a second current path for electron or hole is formed in the insulating region between the another side face of the second high concentration impurity region and another side face of the fist high concentration impurity region, the second current path being deeper than the first current path.

22. The switching circuit device of claim 21, wherein the first high concentration impurity region is connected to an extension part so that upon the start of discharging process of the electrostatic energy through the protecting element a third current path for electron or hole is formed in the insulating region between the extension part and the second high concentration impurity region.

23. The switching circuit device of claim 22, wherein the second high concentration impurity region is connected to another extension part so that upon the start of discharging process of the electrostatic energy through the protecting element a fourth current path for electron or hole is formed in the insulating region between said another extension part and the first high concentration impurity region.

24. The switching circuit device of claim 19 or 21, wherein the width of the first high concentration impurity region is 5 $\mu$m or smaller.

25. The switching circuit device of claim 19 or 21, wherein a conductivity modulation efficiency of the second current path is at least 5 times higher than a conductivity modulation efficiency of the first current path.

26. The switching circuit device of claim 19 or 21, wherein an amount of current that passes through the second current path is equal to or greater than an amount of current that passes through the first current path.

27. The switching circuit device of claim 19 or 21, wherein the second current path is formed to extend from an edge of the first impurity region by at least 10 $\mu$m.

28. The switching circuit device of claim 19 or 21, wherein the second current path is formed is formed away from the bottom faces of the first and second high concentration impurity regions by at least 20 $\mu$m.

29. The switching circuit device of claim 19 or 21, wherein the second current path is configured to expand in response to an increase of the discharged electrostatic energy so as to increase a conductivity modulation efficiency of the second current path.

30. The switching circuit device of claim 19 or 21, wherein the first and second impurity regions are connected so as to increase an electrostatic breakdown voltage of the corresponding transistor by ten times or more from the electrostatic breakdown voltage of the corresponding transistor without the connection, a parasitic capacitance between the first and second impurity regions being 40 fF or smaller.

31. The switching circuit device of claim 20, 22 or 23, wherein a conductivity modulation efficiency of the third current path is at least 5 times higher than a conductivity modulation efficiency of the first current path.

32. The switching circuit device of claim 20, 22 or 23, wherein the third current path is formed to extend from the extension part by at least 10 $\mu$m.

33. The switching circuit device of claim 20, 22 or 23, wherein the third current path is configured to expand in response to an increase of the discharged electrostatic energy so as to increase a conductivity modulation efficiency of the third current path.

34. The switching circuit device of claim 1, wherein the first and second high concentration impurity regions are embedded in the insulating region of the substrate and a width of the insulating region adjacent a back side face of one of the first and second high concentration impurity regions is 10 $\mu$m or larger, the back side face being opposite from a front side face of said one of the first and second high concentration impurity regions which faces the part of the insulating region disposed between the first and second high concentration impurity regions.

35. The switching circuit device of claim 1, wherein the first and second high concentration impurity regions are embedded in the insulating region of the substrate and the insulating region extends from a side of the first or second high concentration impurity region by at least 10 $\mu$m, the side being substantially normal to sides of the first and second high concentration impurity regions facing each other through said portion of the insulating region.

* * * * *